(12) United States Patent
Zhang et al.

(10) Patent No.: US 9,935,063 B2
(45) Date of Patent: Apr. 3, 2018

(54) RLINK-ON-DIE INDUCTOR STRUCTURES TO IMPROVE SIGNALING

(71) Applicant: Intel Corporation, Santa Clara, CA (US)

(72) Inventors: Yu Amos Zhang, Chandler, AZ (US); Jihwan Kim, Portland, OR (US); Ajay Balankutty, Hillsboro, OR (US); Anupriya Sriramulu, Santa Clara, CA (US); MD. Mohiuddin Mazumder, San Jose, CA (US); Frank O'Mahony, Portland, OR (US); Zuoguo Wu, San Jose, CA (US); Kemal Aygun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/201,375

(22) Filed: Jul. 1, 2016

(65) Prior Publication Data
US 2018/0005965 A1    Jan. 4, 2018

(51) Int. Cl.
| | |
|---|---|
| *H01L 23/00* | (2006.01) |
| *H01L 23/64* | (2006.01) |
| *H02H 9/04* | (2006.01) |
| *H01L 27/02* | (2006.01) |
| *H01L 23/66* | (2006.01) |

(52) U.S. Cl.
CPC ............ *H01L 23/645* (2013.01); *H01L 23/66* (2013.01); *H01L 27/0248* (2013.01); *H02H 9/046* (2013.01)

(58) Field of Classification Search
CPC .............................. H01L 23/645; H01L 23/66
See application file for complete search history.

(56) References Cited

U.S. PATENT DOCUMENTS

| 6,459,343 B1 * | 10/2002 | Miller ................. H01L 23/5227 257/664 |
| 2005/0184344 A1 | 8/2005 | Ker et al. |
| 2006/0151851 A1 | 7/2006 | Pillai et al. |
| 2011/0038087 A1 | 2/2011 | Moronval et al. |
| 2013/0163127 A1 | 6/2013 | Chu et al. |
| 2014/0139958 A1 | 5/2014 | Chu et al. |

OTHER PUBLICATIONS

International Search Report and Written Opinion for PCT Patent Application No. PCT/US2017/032940 dated Sep. 12, 2017, 10 pgs.

* cited by examiner

*Primary Examiner* — William Harriston
(74) *Attorney, Agent, or Firm* — Schwabe, Williamson & Wyatt, P.C.

(57) ABSTRACT

Integrated circuit (IC) chip "on-die" inductor structures (systems and methods for their manufacture) may improve signaling from a data signal circuit to a surface contact of the chip. Such inductor structures may include a first data signal inductor having (1) a second end electrically coupled to an electrostatic discharge (ESD) circuit and a capacitance value of that circuit, and (2) a first end electrically coupled to a the data signal surface contact and to a capacitance value at that contact; and a second data signal inductor having (1) a second end electrically coupled to the data signal circuit and a capacitance value of that circuit, (2) a first end electrically coupled to the second end of the first data signal inductor, and to the capacitance value of the ESD circuit. Inductor values of the first and second inductors may be selected to cancel out the capacitance values to improve signaling.

20 Claims, 6 Drawing Sheets

RLINK-ON-DIE INDUCTOR STRUCTURES TO IMPROVE SIGNALING

BACKGROUND

Field

Embodiments of the invention are related in general, to integrated circuit (IC) chip interconnection features for improved signal connections and transmission to and through a data signal communication channel from one chip, through semiconductor device packaging and to another electronic device or chip, including on-die inductor structures to improve signaling in single ended or serial busses.

Description of Related Art

Integrated circuit (IC) chips (e.g., "chips", "dies", "ICs" or "IC chips"), such as microprocessors, coprocessors, graphics processors and other microelectronic devices often use package devices ("packages") to physically and/or electronically attach the IC chip to a circuit board, such as a motherboard (or motherboard interface). The IC chip (e.g., "die") is typically mounted within a microelectronic substrate package or package device that, among other functions, enables electrical connections such as to form a data signal communication channel between the chip and a socket, a motherboard, another chip, or another next-level component (e.g., microelectronic device). Some examples of such package devices are substrate packages, interposers, and printed circuit board (PCB) substrates upon which integrated circuit (IC) chips, next-level components or other package devices may be attached, such as by solder bumps.

There is a need in the field for an inexpensive and high throughput process for manufacturing such chips and packages. In addition, the process could result in a high chip yield and an improved data signal communication channel between the chip and package; or between the chip and a next-level component or chip attached to the package. In some cases, there is a need in the field for a chip having better components for providing stable and clean high frequency transmit and receive data signals through a data signal communication channel between its signal transmit or receive circuits, through one or more packages, and to signal receive or transmit circuits of another next-level component or chip attached to the package(s).

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Figure 1:
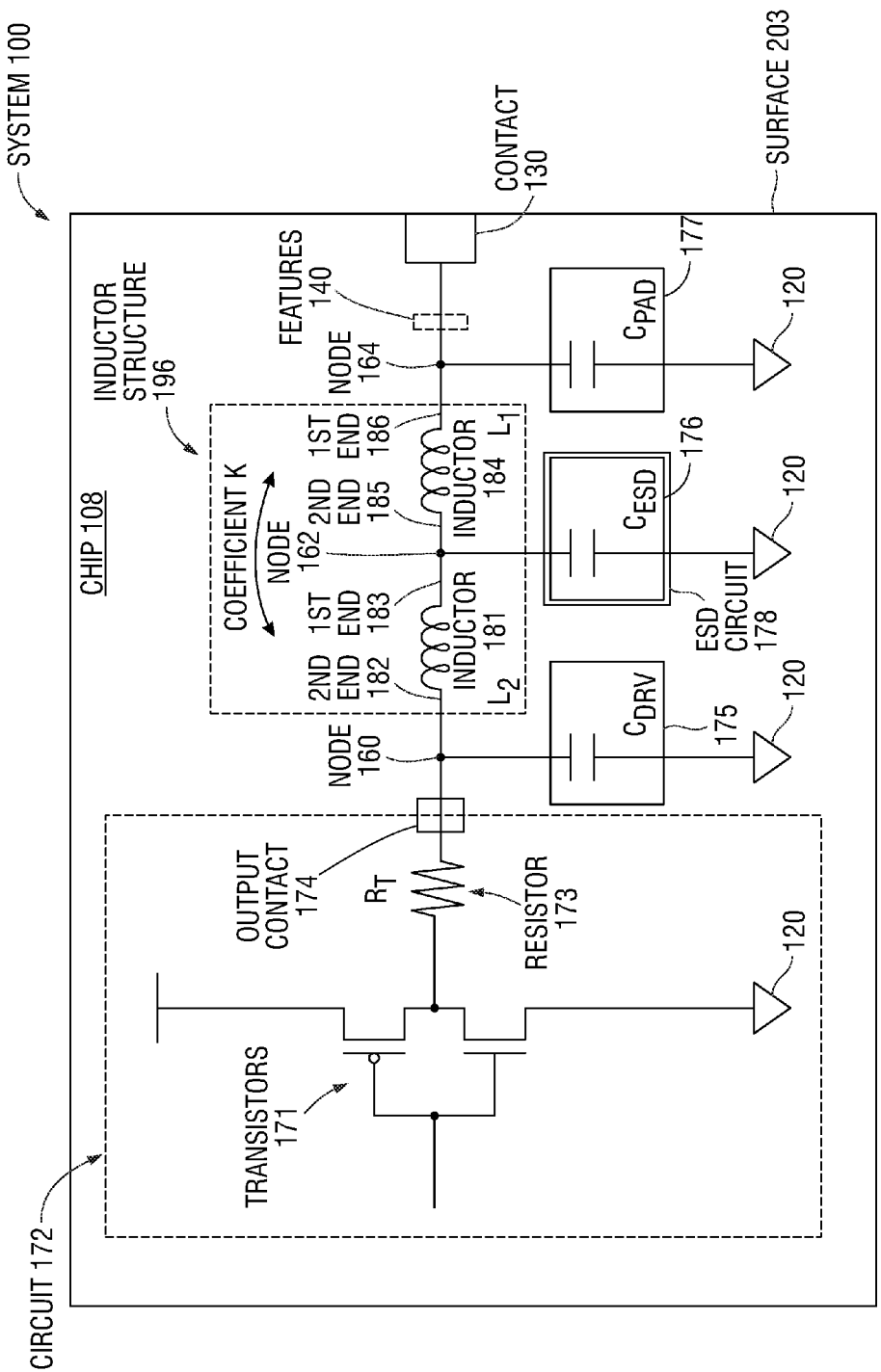
FIG. 1 is schematic view of a computing system including an integrated circuit (IC) chip having "on-die" inductor structures to improve signaling between (e.g., from) a data signal output contact of a data signal circuit and (e.g., to) a data signal surface contact of a chip.

Several embodiments of the invention with reference to the appended drawings are now explained. Whenever the shapes, relative positions and other aspects of the parts described in the embodiments are not clearly defined, the scope of embodiments of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

As integrated circuit (IC) chip or die sizes shrink (e.g., see chip 108) and interconnect densities increase, physical and electrical connections require better components for providing stable and clean high frequency transmit and receive data signals between data signal circuitry (e.g., circuit 172) of a chip and data signal transmission surface contacts (e.g., contact 130) attached or to be attached to a package device (or two physically attached package devices) upon which the IC chip is mounted or is communicating the data signals. In some cases, there is a need for one or two chips to have better data transmission interconnect features (e.g., components) for providing stable and clean high frequency transmit and receive data signals through a data signal communication channel between data signal transmit or receive circuits of one chip mounted on a package, through one or more packages, and to data signal receive or transmit circuits of another next-level component (e.g., microelectronic device) or chip attached to the package(s). This may include for providing stable and clean data signals through surface contacts (e.g., solder bump contacts) on and electrical connections between (e.g., solder bumps or solder ball grid array (BGA)) the chips and package(s). Some examples of such package devices that may be in the data signal communication channel are one (or two physically attached) of the following: substrate packages, interposers (e.g., silicon interposers), silicon bridges, organic interposers (e.g., or technology thereof), and printed circuit board (PCB) substrates upon or onto which integrated circuit (IC) chips or other package devices may be attached.

In some cases, the data signal communication channel includes connections between the IC chip and a package upon or to which the IC chip is mounted, such as between the chip bottom surface (e.g., solder bump contacts) and other components of or attached to the package. The data signal communication channel may include signals transmitted between upper level signal transmit and receive circuitry and contacts or traces of the chip that will be electrically connected through via contacts to contacts on the bottom surface of the chip. In some cases, the data signal communication channel may extend from IC chip mounted on (e.g., having a bottom surface and/or bottom surface signal contacts of a bottom surface physically soldered and attached to a top surface and/or top surface signal contacts of) a microelectronic substrate package, which is also physically and electronically connected to another package, chip or next-level component. Such data signal communication channel may be a channel for signals transmitted from the chip to contacts on the top surfaces of a package that will be electrically connected through via contacts to lower level contacts or traces of one or more the package, and from there to another chip mounted on the package(s). In many cases, a data signal communication channel must route hundreds or even thousands of high frequency data signals between the IC chip(s) and/or other package devices.

According to some embodiments, it is possible for integrated circuit (IC) chip (e.g., chip 108) "on-die" interconnection features (such as on-die inductor structures of FIGS. 1-4) to improve signaling by providing higher frequency and more accurate data signal transfer through a data signal communication channel between a bottom interconnect level or surface (e.g., level LV1) of an IC chip mounted on a top interconnect level (e.g., level L1) of the package device and (1) lower levels (e.g., levels Lj-Ll) of the package device, (2) a next-level component of (e.g., another chip mounted on) the package device, or (3) another package device mounted to the top or bottom of the package device (or a next-level component or another chip mounted on the second package device).

According to some embodiments, it is possible for IC chip "on-die" inductor structures to improve signaling by canceling or reducing the effects of capacitance that exists between the data signal output contact of a data signal generation (e.g., transmit or receive) circuit and the data signal surface contact of the chip (e.g., the contact for using a solder bump or ball to attach the chip to another device or package) of a "single ended" channel or bus. According to some embodiments, it is possible for the on-die inductor structures to cancel out parasitic capacitance at (e.g., existing at, measured at, or "looking into") the data signal surface contact or solder bump that may be associated with the active circuitry devices, such as those of the single ended data signal transmit or receive circuitry of the chip.

In some cases, such a chip may be described as a "chip having on-die inductor structures to improve signaling" or a "chip having on-die inductor structures for improved signal connections and transmission through a semiconductor device package channel" (e.g., devices, systems and processes for forming).

In some cases, a "single ended" channel or bus includes is capable of successfully sending a high speed data signal through such a channel without using "differential" bus technology or differential bus pairs of positive and negative polarity versions of the same signals (e.g., on two wires or channels).

According to some embodiments, it is possible for the on-die inductor structures to exist between the data signal (e.g., transmit or receive) circuitry of the chip and other on-die interconnect features that provide additional help with improve signaling by providing higher frequency and more accurate data signal transfer through a data signal communication channel between an IC chip and another device or chip mounted on one or more package device(s). Such other on-die interconnect features may include leadway (LDW) routing and/or LDW traces in same and/or in other levels of the chip, and between the on-die inductor structures and data signal surface contact or die bump contact locations (e.g., on a surface of the chip).

FIG. 1 is schematic view of a computing system including an integrated circuit (IC) chip having "on-die" inductor structures to improve signaling between (e.g., from) a data signal output contact of a data signal circuit and (e.g., to) a data signal surface contact of a chip. FIG. 1 may show a schematic bottom view that includes bottom surface 203 of chip 108, but otherwise shows various components, interconnect features, and/or inductor structures that may exist on levels LV1-LV5 that are above bottom surface 203. FIG. 1 shows computing system 100 including IC chip 108 having "on-die" inductor structures 196 to improve signaling between (e.g., from) a data signal output contact 174 of a data signal (e.g., transmit or receive) circuit 172 and (e.g., to) a data signal surface contact 130 of chip 108. In some cases, chip 108 is an integrated circuit chip having inductor structures 196 (e.g., interconnect features) to improve signaling though a data signal channel of electronic system 100.

In some cases, system 100 is or includes a "single ended" data signal channel or bus (e.g., for single ended connections and transmission through semiconductor device packages) originating at circuit 172 and extending through structures 196 to contact 130 in chip 108; then through a solder bump on contact 130 and to a package device, through the package device; through a solder bump; and into and through another chip to another data signal circuit.

According to embodiments, contact 130 may be a data signal surface contact upon which a solder bump may be formed for attaching contacts 130 to an opposing, upper level data signal contact of a package or another electronic device. Contact 130 may be a data signal surface contact disposed on an exposed horizontal (e.g., bottom) surface 203 of chip 108. This bottom surface is shown on the right side of chip 108 in FIG. 1, but it can be appreciated that it may be a surface contact on the bottom of the chip such as a contact for attaching to an opposing data signal surface contact on an exposed top surface of a package device using a solder bump or ball (or other electrically conductive attachment as known). Contact 130 may be formed over or on (e.g., having a bottom surface planar with) bottom surface 203 of bottom level LV1 of chip 108 (e.g., see FIGS. 1 and 4A-D).

Surface contact 130 may be electrically coupled to (e.g., with less than 10 Ohm resistance) or physically attached to (e.g., touching) node 164. This connection may extend through one or more of levels LV1-LV5 of chip 108 (e.g., see FIGS. 4A-D). In some cases a "node" as described herein may be (or include) a location or part of an electrically conductor material trace or routing connecting two or more electrical components. Node 164 may be electrically coupled to or physically attached to: (1) first end 186 of first inductor 184 (e.g., of the inductor structure 196), (2) contact 130 (or features 140), and (3) capacitance 177 representing capacitance Cpad of contact 130.

In some cases, node 164 represents an electrical node or electrically conductive attachment of contact 130, first end 186 and capacitance 177. In some cases, node 164 includes one or more on-die signal traces, signal contacts, signal via contacts electrically coupled between first end 186 of inductor 184 and contact 130.

In some cases, capacitance 177 represents all of the capacitance associated with the signal surface contact 130. It may represent all of the capacitance between the first end 186 of first inductor 184 and the surface contact 130. In some cases, it also includes the capacitance of the surface contact 130 and a solder bump formed thereon to connect the surface contact with an opposing contact, such as of a package device. In some cases, capacitance 177 represents a capacitance value Cpad between node 164 and ground 120 (e.g., a ground signal as known in the art). In some cases, the capacitance 177 includes all of the capacitance of all on-die interconnect features, signal traces, signal contacts, signal via contacts, signal LDW traces, surface contacts, and wiring between node 164 and the surface contact or pad 130.

In some cases, capacitance 177 is a capacitance that is between (e.g., from) contact 130 (or optionally features 140 if they exist) and (e.g., to) ground. It may be a capacitance measure at node 164, from the perspective of end 186, such as by disconnecting end 186 from node 164 and replacing it with a measurement device or meter capable of measuring capacitance, and measuring the capacitance (e.g., 177) "looking into" contact 130 (or optionally features 140 if they exist) while end 186 is disconnected.

In some cases, capacitance 177 is between 0.5 and 2.0 pF (pico Farad). In some cases, it is between 0.75 and 1.5 pF. In some cases, it is between 20 and 500 femto (e.g., E-15) Farad (fF). In some cases, it is between 30 and 100 fF. In some cases, it is between 40 and 60 fF. In some cases, it depends on the packaging technology, such as whether structures 169 are formed using a package or package device design rule, or an IC chip design rule.

In some cases, system 100 (e.g., chip 108) includes other on-die interconnect features 140 that provide additional help with improve signaling by providing higher frequency and more accurate data signal transfer through a data signal communication channel between chip 108 and another device or chip mounted on one or more package device(s). In this case, capacitance 177 may include any capacitance due to features 140, and those due to Cpad described herein (e.g., capacitance looking into contact 130).

Such other on-die interconnect features may include leadway (LDW) routing and/or LDW traces in same (e.g., levels LV2-LV5) and/or in other levels of the chip as structure 196, and between node 164 or (the second end of the second inductor) and data surface contact 130. In some cases, features 140 are electrically coupled to or physically attached to (e.g., between) node 164 and contact 130.

According to embodiments, inductor 184 may be a first data signal inductor of inductor structure 196. It may be located in electrical series with and between inductor 181 and surface 130. According to embodiments, inductor 184 may be a passive electrical device inductor that provides inductance L1 between (e.g., from) second end 185 and (e.g., to) first end 186 (and in the reverse direction as well). Inductor 184 may be formed within one or more of levels LV2-LV5 of chip 108 (e.g., see FIGS. 4A-D).

Inductor 184 may have first end 186 electrically coupled or physically attached to node 164 and second end 185 electrically coupled or physically attached to node 162. This connection of end 185 may extend through one or more of levels LV2-LV5 of chip 108 (e.g., see FIGS. 4A-D). In some case, inductor 184 may have first end 186 electrically coupled or physically attached to contact 130 (or features 140) and capacitance 177; and second end 185 electrically coupled or physically attached to first end 183 of inductor 181 and capacitance 176.

Node 162 may be electrically coupled to or physically attached to: (1) a second end 185 of a first inductor 184 (e.g., of the inductor structure 196), (2) a first end 183 of a second inductor 181 (e.g., of the inductor structure 196), and (3) capacitance 176 representing capacitance Cesd of ESD circuit 178.

In some cases, node 162 represents an electrical node or electrically conductive attachment of second end 185, first end 183, and capacitance 176. In some cases, node 162 includes one or more on-die signal traces, signal contacts, signal via contacts electrically coupled between second end 185 and first end 183.

Inductor 184 may be a first data signal inductor having: (1) second end 185 electrically coupled (e.g., attached, or with less than 10 ohm resistance) to capacitance value 176 that represents capacitance Cesd of an electrostatic discharge (ESD) circuit 178 (e.g., where Cesd is between second end 185 of first inductor 184 and ground 120 when looking at end 183), and (2) first end 186 electrically coupled (attached, or with less than 10 ohm resistance) to capacitance value 177 (inherent Cpad) that represents a capacitance Cpad of the data signal surface contact 130 (e.g., where Cpad is between the first end 186 of the first inductor 184 and ground 120 when looking at contact 130) and to the data signal surface contact 130.

In some cases, electrostatic discharge (ESD) circuit 178 is or includes an ESD diode to provide ESD protection as known in the art for an IC chip data signal path or channel (e.g., data transmission to and through a channel).

It may be located in electrical series with and between inductor 184 (e.g., end 185) and inductor 181 (e.g., end 183). According to embodiments, circuit 178 may provide a discharge of an amount of electrical static or charge buildup (e.g., that is over a threshold level) existing at node 162, through (e.g., from) circuit 178 and (e.g., to) ground 120. It may be formed within levels LV2-LV5 of chip 108 (e.g., see FIGS. 4A-D).

It can be appreciated that structure 196 may not be used or relevant in an ESD event, such as when ESD charge is being discharged through circuit 178 to ground. However, it is noted that inductor 181 provides a benefit during an ESD event by presenting a high impedance (e.g., inductance L2) for high-frequency ESD currents (e.g., also being discharged through ESD circuit 178), thus providing additional protection for the transmitter devices from unexpected high-frequency ESD currents.

Capacitance 176 may be an inherent capacitance of ESD circuit 178. In some cases, it may include the capacitance of an ESD diode of circuit 178. In some cases, capacitance 176 represents all of the capacitance associated with the ESD circuit 178. It may represent all of the capacitance between the first end 183 of second inductor 181 and second end 185 of first inductor 184. In some cases, capacitance 176 represents a capacitance value Cesd between (e.g., from) node 162, through the ESD circuit 178, and to ground 120 (e.g., a ground signal as known in the art).

In some cases, the capacitance 176 also includes all of the capacitance of any wiring or traces from ends 183 and 185 to circuit 178 (e.g., as well as Cesd of circuit 178). In some cases, the capacitance 176 includes all of the capacitance of all on-die interconnect features, signal traces, signal contacts, signal via contacts, signal LDW traces, surface contacts, and wiring between node 162, through circuit 178 and to ground 120.

In some cases, capacitance 176 is a capacitance that is between (e.g., from) end 183 and end 185 and (e.g., to) ground. It may be a capacitance measure at node 162, from the perspective of ends 183 and 185, such as by disconnecting ends 183 and 185 from node 162 and replacing them with a measurement device or meter capable of measuring capacitance, and measuring the capacitance (e.g., 176) "looking into" circuit 178 while ends 183 and 185 are disconnected.

In some cases, capacitance 176 is between 0.5 and 2.0 pF (pico Farad). In some cases, it is between 0.75 and 1.5 pF.

According to embodiments, inductor 181 may be a second data signal inductor of inductor structure 196. It may be located in electrical series with and between inductor 184 and output contact 174. According to embodiments, inductor 181 may be a passive electrical device inductor that provides inductance L2 between (e.g., from) second end 182 and (e.g., to) first end 183 (and in the reverse direction as well). Inductor 181 may be formed within levels LV3-LV5 of chip 108 (e.g., see FIGS. 4A-D).

Inductor 181 may have first end 183 electrically coupled or physically attached to node 162 and second end 182 electrically coupled or physically attached to node 160. This connection of ends 183 and 182 may extend through one or more of levels LV2-LV5 of chip 108 (e.g., see FIGS. 4A-D). In some case, inductor 181 may have first end 183 electrically coupled or physically attached to second end 185 of inductor 184 and capacitance 176; and second end 182 electrically coupled or physically attached to contact 174 and capacitance 175.

Node 160 may be electrically coupled to or physically attached to: (1) a second end 182 of a second inductor 181 (e.g., of the inductor structure 196), (2) data signal output contact 174 (e.g., of the circuit 172), and (3) capacitance 175 representing capacitance Cdrv of data signal output circuit 172.

In some cases, node 160 represents an electrical node or electrically conductive attachment of second end 182, contact 174, and capacitance 175. In some cases, node 160 includes one or more on-die signal traces, signal contacts, signal via contacts electrically coupled between second end 182 and contact 174.

Inductor 181 may be a second data signal inductor having: (1) second end 183 electrically coupled (e.g., attached, or with less than 10 ohm resistance) data signal output contact 174 (or to resistor 173) of the data signal circuit 172, and to capacitance value 175 that represents capacitance Cdrv of data signal circuit 172 (e.g., where Cdrv is between output contact 174 and ground 120); and (2) first end 183 electrically coupled (attached, or with less than 10 ohm resistance) to second end 185 of first inductor 184, and to capacitance value 176 (inherent Cesd) that represents a capacitance Cesd of the ESD circuit 178 (e.g., where Cesd is between the second end 185 of the first inductor 184, through ESD circuit 178, and to ground 120). I some cases, Cesd may be a capacitance between the first end 183 of the second inductor 181, through the ESD circuit 178 and to ground 120.

In some cases, capacitance 175 represents all of the capacitance associated with circuit 172 (e.g., at output contact 174). It may represent all of the capacitance between the second end 182 of inductor 181 and ground (e.g., looking into circuit 172). In some cases, it also includes the capacitance of contact 174, resistor 173 and transistors 171. In some cases, capacitance 175 represents a capacitance value Cdrv between node 160 and ground 120 (e.g., a ground signal as known in the art). In some cases, the capacitance 175 includes all of the capacitance of all on-die interconnect features, signal traces, signal contacts, signal via contacts, signal LDW traces, surface contacts, and wiring between node 160 and contact 174.

In some cases, capacitance 175 is a capacitance that is between (e.g., from) contact 174 and (e.g., to) ground. It may be a capacitance measure at node 160, from the perspective of end 182, such as by disconnecting end 182 from node 160 and replacing it with a measurement device or meter capable of measuring capacitance, and measuring the capacitance (e.g., 175) "looking into" contact 174 while end 182 is disconnected.

In some cases, capacitance 175 is between 0.5 and 2.0 pF (pico Farad). In some cases, it is between 0.75 and 1.5 pF. In some cases, it is between 100 fF and 10 pF. In some cases, it is between 300 fF and 1 pF. In some cases, it is between 500 fF and 800 fF. In some cases, it depends on the technology of data signal circuit 172, such as depending on the types and sizes of electronic devices used in circuit 172.

Data signal circuit 172 may be or include a data signal circuit (e.g., a transmitter or receiver) of a data signal channel through a package and to another device or chip. Data signal circuit 172 may represent data signal transmit or receive circuit (TX or RX) disposed on one or more horizontal inner levels within chip 108 and having a data signal output contact 174 upon which circuit 172 can provide a high speed data signal suitable for transmission across a channel having a length of between 3 and 50 mm (e.g., through a package device and) to an opposing data signal circuit (e.g., receive or transmit, respectively) of another electronic device or chip. Data signal circuit 172 may be a high speed data signal voltage mode driver, transmit circuit, receive circuit 172, or another data signal circuit as known in the art for transmitting or receiving analog data or digital data at high speeds. Data signal circuit 172 may be formed within one or more of levels LV3-LVN of chip 108 (e.g., see FIGS. 4A-D).

In some cases, circuit 172 (e.g., at contact 174) may generate a data signal having a speed (e.g., frequency) of between 2 and 10 GHz. In some cases, it may be between 4 and 9 GHz. In some cases, it may be between 7 and 9 GHz. In some cases, it may be 8 GHz.

In some cases, circuit 172 may include signal output transistors 171 for outputting a high speed data signal to a first end of resistor 173 which has a second end electronically attached to data signal output contact 174. Circuit 172 (and structures thereof) may be formed within one or more of levels LV3-LV5 of chip 108 (e.g., see FIGS. 4A-D). In some cases, transistors (e.g., logic and gate structures for a microprocessor) may be located in levels LV5 or higher (e.g., level LN) of chip 108 (e.g., see FIGS. 4A-D). In some cases, circuit 172 does not include transistors 171 or resistor 173, but has proper circuitry (e.g., as known in the art) to transmit or receive a data signal as described herein. In some cases, circuit 172 does not include contact 174, transistors 171 or resistor 173, but has proper circuitry (e.g., as known in the art) to transmit or receive a data signal as described herein, such as at node 160 (e.g., directly and without contact 174).

In some cases, contact 174 may represent a location, trace or conductor material contact at which circuit 172 outputs a high speed data signal. It may be an end of resistor 173 that is opposite the end of that resistor which is electronically coupled or physically attached to transistors 171. Contact 174 may be located in electrical series with and between resistor 173 and node 160 (e.g., end 182). According to embodiments, contact 174 may provide a high speed data signal having a speed (e.g., frequency) of between 2 and 10 GHz from circuit 172 for transmission through structure 196 and to contact 130 (such as for transmission through a data signal channel through a package and to another device or chip).

In some cases, output contact 174 may be electrically coupled to (e.g., with less than 10 Ohm resistance) or physically attached to (e.g., touching) node 160. Node 160 may be electrically coupled to or physically attached to a second end 182 of a second inductor 181 (e.g., of the inductor structure) and capacitance representing Cdrv. Contact 174 may be formed within one of levels LV3-LV5 of chip 108 (e.g., see FIGS. 4A-D).

In some cases, resistor 173 may be or include a resistor at the output of circuit 172 that provides a selected or predetermined amount of desired resistance Rt (e.g., looking into circuit 172) for data signal circuit (e.g., a transmitter) of a data signal channel through a package and to another device or chip. Resistor 173 may be formed within one or more of levels LV3-LV5 of chip 108 (e.g., see FIGS. 4A-D).

Resistance Rt may be between 10 and 100 Ohms. In some cases it is between 25 and 75 Ohms. In some cases it is between 40 and 60 Ohms. In some cases it is approximately 50 Ohms.

Resistor 173 may be a passive electrical device resistor, which is electronically coupled or physically attached between transistors 171 and contact 174. It may be located in electrical series with and between transistors 171 and contact 174. According to embodiments, it may pass a high speed data signal having a speed (e.g., frequency) of between 2 and 10 GHz from circuit 172 for transmission through structure 196 and to contact 130 (such as for transmission through a data signal channel to another device or chip).

In some cases, transistors 171 may be or include one or more output transistors at the output of circuit 172 that generate (e.g., a transmitter) or receive a data signal of a data signal channel through a package and to another device or chip. Transistors 171 may be formed within one or more of levels LV3-LVN of chip 108 (e.g., see FIGS. 4A-D). In some cases, transistors 171 may be located in levels LV5 or higher (e.g., level LN) of chip 108 (e.g., see FIGS. 4A-D).

In some cases, transistors 171 may be active electrical devices, which have an output electronically coupled or physically attached to resistor 173. They may be located in electrical series with resistor 173. According to embodiments, they may provide a high speed data signal having a speed (e.g., frequency) of between 2 and 10 GHz from circuit 172 for transmission through resistor 173, through structure 196 and to contact 130 (such as for transmission through a data signal channel to another device or chip).

Inductor 184 may represent a first inductor coil having at least one conductive material loop, a first inductance L1, and having coupling coefficient K with inductor 181. Inductor 181 may represent a second inductor coil having at least one conductive material loop, a second inductance L2, and having coupling coefficient K with inductor 184. Inductors 181 and 184 may be discrete inductors, or inductors formed as part of an IC chip 108. In some cases, inductors 181 and 184 are formed in levels of IC chip 108.

In some cases, inductors 181 and 184 may be or include conductor material wires or traces in at least one loop or circle in at least one level of IC chip 108. In some cases, inductors 181 and 184 includes multiple loops (e.g. coils, wraps, turns, windings, spirals, curls, rectangles, squares, ovals or circles) of a conductive trace formed on one or more levels of a chip. Each loop may represent one single loop or circle (e.g., 360 degrees of structure or shape having an open center) of a number of loops, coils, wraps, turns, windings, spirals, curls, rectangles, squares, ovals or circles of conductor material. Such as conductor material may be a solid metal (e.g., copper or similar) or alloy trace, wire or other inductor structure as known. In some cases, the one or more loops may be disconnected at a point or area where they are connected through via contacts and a trace on another level.

In some cases, the coupling coefficient K between L1 and L2 may cause a magnetic field of one of the inductors caused by a data signal existing on or being transmitted through that inductor, causing a proportional magnetic field in the other inductor. In some cases the inductors are described as "coupled" inductors based on having the coupling coefficient. In some cases the coupling coefficient is between 5.5 and 7 a data speed of 20 GHz. In some cases it is between 0 and 1 at a data speed of between 4 and 15 GHz. In some cases it is as close to +1 as possible. In some cases it is between 0.5 and 0.8 at a data speed of between 4 and 15 GH. In some cases it is between 0.5 and 0.7 at a data speed of between 4 and 15 GHz.

In some cases, inductors 181 and 184 may be located (e.g., on one or more levels of the chip) and electrically coupled (e.g., on one or more levels of the chip) to the data signal surface contact, ESD circuit and data signal circuit so that a data signal transmitted by the data signal circuit flows (e.g., has electrical current moving) in the same direction through the loops of both inductors 181 and 184 (e.g., clockwise if circuit 172 is a data signal transmit circuit, or counterclockwise if circuit 172 is a data signal receive circuit).

In some cases, inductors 181 and 184 may be located (e.g., on one or more levels of the chip) and electrically coupled (e.g., on one or more levels of the chip) to the data signal surface contact, ESD circuit and data signal circuit such that a magnetic field produced by the second inductor when a data signal is output by the data signal circuit towards the data signal circuit output, causes a magnetic field proportional to the data signal by coupling coefficient K, to be received by the first inductor. It can be appreciated that in this case, a magnetic field produced by the first inductor when the data signal is output by the data signal circuit towards the data signal circuit output may also (e.g., at the same time) cause a magnetic field proportional to the data signal by coupling coefficient K, to be received by the second inductor.

In some cases, inductors 181 and 184 may be located (e.g., on one or more levels of the chip) and electrically coupled (e.g., on one or more levels of the chip) to the data signal surface contact, ESD circuit and data signal circuit so that a data signal transmitted by the data signal circuit flows (e.g., has electrical current moving) in the same direction through the loops of the first and second inductors, such that a magnetic field produced by the second inductor when the data signal is output by the data signal circuit towards the data signal circuit output, causes a magnetic field proportional to the data signal output by a coupling coefficient amount K, to be received by the first inductor According to embodiments, the on die inductor structures 196 may be on both of a data transmit chip and a data receive chip of a single data signal channel. In some cases, they will be on the receive chip only. On some cases, they will be on the transmit chip only. Determining whether they are needed on either or both chips may depend on the lossiness of the channel between the transmitter circuit of one chip and the receiver of the other chip.

In some embodiments, chip 108 is a data signal transmit (e.g., TX) chip having "on-die" inductor structures 196 to improve signaling from a data signal transmit output contact 174 of a data signal transmit circuit 172 to a data signal transmit surface contact 130 of chip 108. In some embodiments, chip 108 is a data signal receive (e.g., RX) chip having "on-die" inductor structures 196 to improve signaling from a data signal receive surface contact 130 of a data to a data signal receive output contact 174 of a data signal receive circuit 174 of chip 108.

In some embodiments, a version of chip 108 that is a data signal transmit (e.g., TX) chip having "on-die" inductor structures 196 as noted above is mounted onto one area of one or more packages and a second version of chip 108 that is a data signal receive (e.g., RX) chip having "on-die" inductor structures 196 is mounted onto another area of the one or more package devices. This may form one or more data signal channels from the data signal transmit circuits 172 of the version of chip 108 that is a data signal transmit (e.g., TX) chip, through the one or more package devices and to data signal receive circuits 172 of the version of chip 108 that is a data signal receive (e.g., RX) chip. The channels may include solder bumps between surface contacts of the chips and package(s), surface contacts, via contacts traces and other structure of the one or more package devices.

According to embodiments, the on die inductor structures 196 may be on a data transmit chip, a data receive chip, or both, as noted, for each channel of multiple data signal channels existing between a transmitter circuit of a first chip, extending through one or more package devices, and to a receiver circuit of a second chip. In some cases, there may be between 1 and 500 such channels between the chips. In some cases, there may be between 10 and 400 such channels between the chips. In some cases, there may be between 20 and 200 such channels between the chips. Determining whether they are needed on either or both chips may depend on an analysis of the lossiness of many or all of the channels between the transmitter circuit of one chip and the receiver of the other chip.

Figure 2:
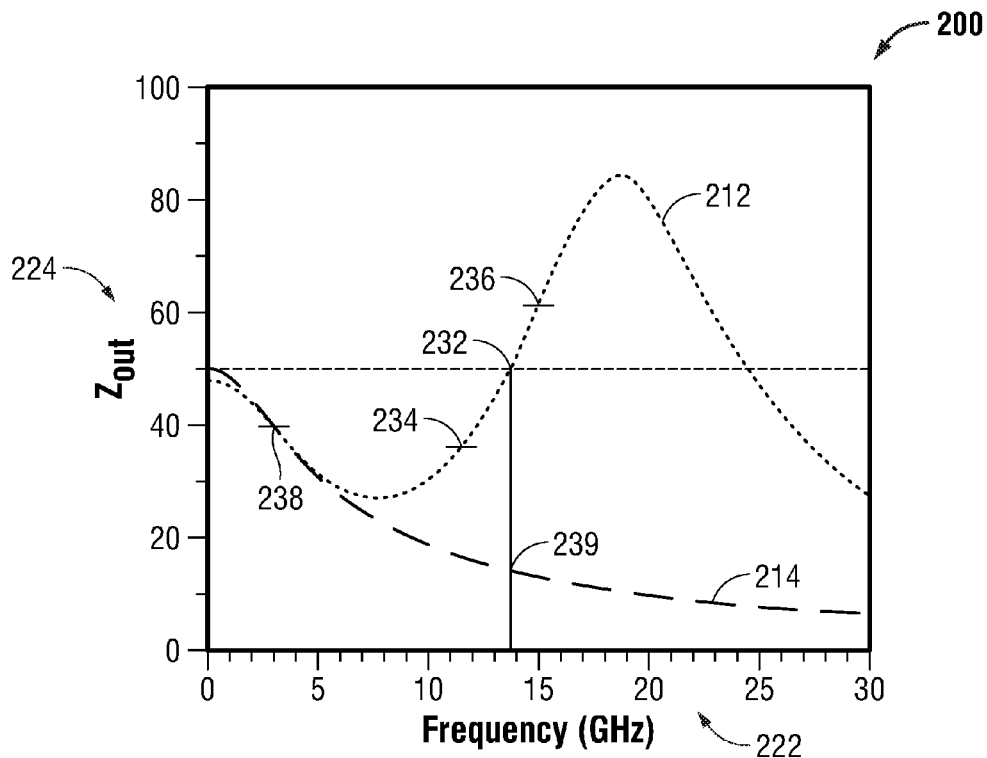
FIG. 2 shows an example of a graph of impedance measured at a data signal surface contact of an IC chip having "on-die" inductor structures to improve signaling between a data signal output contact of a data signal circuit and a data signal surface contact of a chip, and a chip without the inductor structures.
Figure 3:
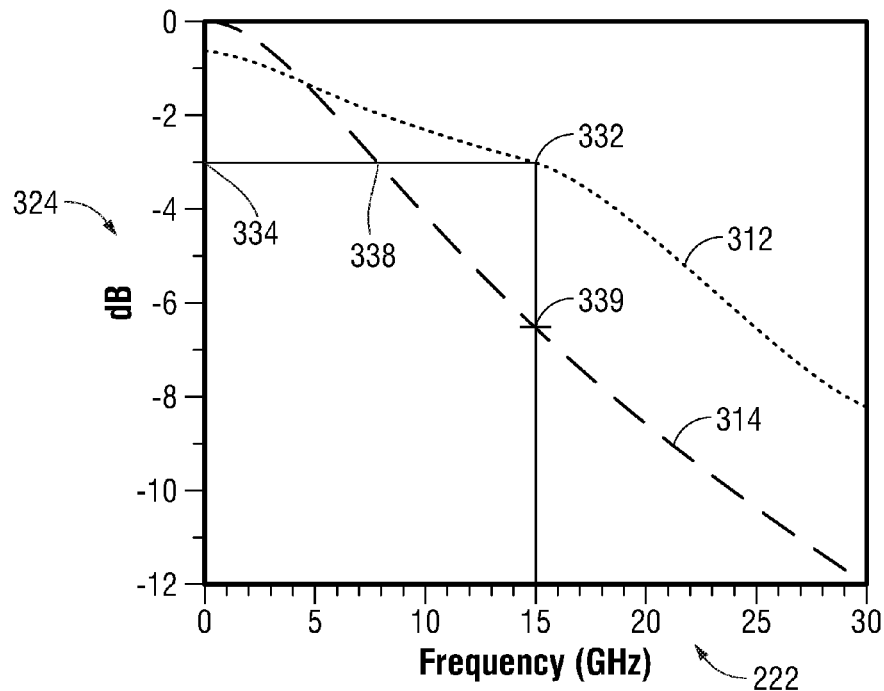
FIG. 3 shows an example of a graph of insertion loss measured at a data signal surface contact of an IC chip having "on-die" inductor structures to improve signaling between a data signal output contact of a data signal circuit and a data signal surface contact of a chip, and a chip without the inductor structures.

FIGS. 2-3 may be examples of a results from or related to (e.g., laboratory or test) experiments or simulations performed on or for a chip having on-package chip inductor structures 169 described herein that can communicate high speed data signals to a package device, or through one or more package device(s) and to another chip as described herein. In some cases, inductors 181 and 184 (e.g., inductor structures 169) are designed (e.g., the inductance L2 of the second inductor and inductance L1 of the first inductor (and optionally coefficient K) can be selected or predetermined) to cause the impendance measured at (e.g., looking into) the surface contact 130 to be desired impedance (e.g., resistance, with zero capacitance and zero inductance looking into or at surface contact 130) at a desired frequency (e.g., see Zout 224 and frequency 222 of FIG. 2). In some cases, they are designed to cause the insertion loss measured at (e.g., looking into) the surface contact 130 to be desired insertion loss (e.g., looking into or at surface contact 130) at a desired frequency (e.g., see insertion loss 324 and frequency 222 of FIG. 3).

FIG. 2 shows an example of a graph of impedance measured at a data signal surface contact of an IC chip having "on-die" inductor structures to improve signaling between a data signal output contact of a data signal circuit and a data signal surface contact of a chip, and a chip without the inductor structures. FIG. 2 shows graph 200 of impedance Zout 224 measured at a data signal surface contact 130 (e.g., looking into contact 130 towards node 164) of an IC chip having "on-die" inductor structures 169 to improve signaling between a data signal output contact 174 of a data signal circuit 172 and a data signal surface contact 130 of a chip; as compared to a chip without the inductor structures.

FIG. 2 shows graph 200 having plot 212 of impedance Zout 224 for a chip having inductors 181 and 184 (e.g., inductor structures 169) with respect to data signal speed or frequency 222 (e.g., gigahertz—GHz). FIG. 2 shows graph 200 having plot 214 of impedance Zout 224 for a chip not having (e.g., excluding) inductors 181 and 184 (e.g., inductor structures 169) with respect to data signal speed or frequency 222. In some cases, frequency 222 represents data signals having a frequency in gigahertz—GHz. In some cases, frequency 222 represents data signals having a frequency in gigatransfers per second (GT/s). In some cases, GT/s may refer to a number of operations (e.g., transmission of digital data such as the data signal herein) transferring data that occur in each second in some given data transfer channel such as a channel provided by the on-die inductor structures 196; or may refer to a sample rate, i.e. the number of data samples captured per second, each sample normally occurring at the clock edge. 1 GT/s is $10^9$ or one billion transfers per second.

In some cases, (e.g., as shown for plot 212 in FIG. 2) inductors 181 and 184 (e.g., for embodiments including inductor structures 169) are designed or "tuned" (e.g., the inductance L2 of the second inductor and inductance L1 of the first inductor (and optionally coefficient K) are selected or predetermined) to cause the impedance measured at (e.g., looking into) the surface contact 130 to be a desired impedance that is a resistance of approximately 50 Ohms at crossing 232 (with approximately zero capacitance and approximately zero inductance) looking into or at surface contact 130 at a desired frequency of approximately 13.5 GHz at crossing 232. In some cases, they are designed or "tuned" to cause a desired impedance range that is a resistance of between 40 and 60 Ohms at crossings 234 and 236, respectively (with approximately zero capacitance and approximately zero inductance) looking into or at surface contact 130 at a desired frequency range of between 12 and 15 GHz at crossings 234 and 236, respectively.

On the other hand, plot 214 of impedance Zout 224 for a chip not having (e.g., excluding) inductors 181 and 184 (e.g., inductor structures 169) with respect to data signal speed or frequency 222 may represent a chip having only a resistor and capacitor (e.g., RC) load such as with resistor 173 (resistance Rt) and capacitance (e.g., capacitance equal to capacitance 175 plus 176 plus 177, since the capacitances are not decreased or canceled by inductor structures 169). In some cases, (e.g., as shown for plot 214 in FIG. 2) not having inductors 181 and 184 (e.g., for embodiments excluding inductor structures 169) causes the impedance measured at (e.g., looking into) the surface contact 130 to be an undesired impedance that is a resistance dropping below 40 Ohms (e.g., smaller or fewer Ohms than 40 Ohms) at crossing 238 (with approximately capacitance=175 plus 176 plus 177) looking into or at surface contact 130 at a frequency of only approximately 3.5 GHz at crossing 238. In some cases, not having inductors 181 and 184 causes the impendence measured at (e.g., looking into) the surface contact 130 to be an undesired impedance that is a resistance dropping below 20 Ohms at crossing 239 (with approximately capacitance=175 plus 176 plus 177) looking into or at surface contact 130 at a frequency of only approximately 13.5 GHz at crossing 239.

That is, in some embodiments, while impedance of plot 212 looking into the driver circuit 172 from contact 130 is closer to an ideal 50 Ohms at a high frequency (e.g., 12-14 GHz or GT/S), for the case without the inductor structures 169 (just RC load) impedance of plot 214 is below 20 Ohms and has capacitance. Thus, for plot 212 the impedance is close to 50 Ohm, and the signal reflection at (e.g., looking into) the contact 130 is smaller, and better for a data signal channel at the high frequencies as described herein. For instance, in some cases, having an impedance above 40 Ohms (e.g., between 40 and 60 Ohms) is extended from 2.5 GHz at crossing 238 to above 12 GHz at crossing 234.

FIG. 3 shows an example of a graph of insertion loss measured at a data signal surface contact of an IC chip having "on-die" inductor structures to improve signaling between a data signal output contact of a data signal circuit and a data signal surface contact of a chip, and a chip without the inductor structures. FIG. 3 shows graph 300 of insertion loss 324 in decibels (dB) 324 measured at a data signal surface contact 130 (e.g., looking into contact 130 towards node 164) of an IC chip having "on-die" inductor structures 169 to improve signaling between a data signal output contact 174 of a data signal circuit 172 and a data signal surface contact 130 of a chip; as compared to a chip without the inductor structures.

FIG. 3 shows graph 300 having plot 312 of insertion loss dB 324 for a chip having inductors 181 and 184 (e.g., inductor structures 169) with respect to data signal speed or frequency 222 (e.g., gigahertz—GHz). FIG. 3 shows graph 300 having plot 314 of insertion loss dB 324 for a chip not having (e.g., excluding) inductors 181 and 184 (e.g., inductor structures 169) with respect to data signal speed or frequency 222 (e.g., gigahertz—GHz or GT/s).

In some cases, (e.g., as shown for plot 312 in FIG. 3) inductors 181 and 184 (e.g., for embodiments including inductor structures 169) are designed or "tuned" (e.g., the inductance L2 of the second inductor and inductance L1 of the first inductor (and optionally coefficient K) are selected or predetermined) to cause the insertion loss measured at (e.g., looking into) the surface contact 130 to be a desired insertion loss that is approximately −3 dB at crossing 332 looking into or at surface contact 130 at a desired frequency of approximately 15 GHz at crossing 332. In some cases, they are designed or "tuned" to cause a desired insertion loss range that is between 0 dB and −3 dB at crossings 334 and 332, respectively looking into or at surface contact 130 at a desired frequency range of between 0 and 15 GHz at crossings 334 and 332, respectively.

On the other hand, plot 314 of insertion loss dB 324 for a chip not having (e.g., excluding) inductors 181 and 184 (e.g., inductor structures 169) with respect to data signal speed or frequency 222 may represent a chip having only a resistor and capacitor (e.g., RC) load such as with resistor 173 (resistance Rt) and capacitance (e.g., capacitance equal to capacitance 175 plus 176 plus 177, since the capacitances are not decreased or canceled by inductor structures 169). In some cases, (e.g., as shown for plot 314 in FIG. 3) not having inductors 181 and 184 (e.g., for embodiments excluding inductor structures 169) causes the insertion loss measured at (e.g., looking into) the surface contact 130 to be an undesired insertion loss that is dropping below −3 dB (e.g., more loss such as more negative than −3 dB along dB 324) at crossing 338 (with approximately capacitance=175 plus 176 plus 177) looking into or at surface contact 130 at a frequency of only approximately 7.5 GHz at crossing 338. In some cases, not having inductors 181 and 184 causes the insertion loss measured at (e.g., looking into) the surface contact 130 to be an undesired insertion loss that is a resistance dropping below −7 dB at crossing 339 (with approximately capacitance=175 plus 176 plus 177) looking into or at surface contact 130 at a frequency of only approximately 15 GHz at crossing 339.

That is, in some embodiments, while insertion loss of plot 312 looking into the driver circuit 172 from contact 130 is closer to an ideal −3 dB at a high frequency (e.g., 15 GHz or GT/S), for the case without the inductor structures 169 (just RC load) insertion loss of plot 314 is below −7 dB. Thus, for plot 312 the 3 dB insertion loss bandwidth for the data signal at (e.g., looking into) the contact 130 is larger or extended; and better for a data signal channel at the high frequencies as described herein. For instance, in some cases, it is extended from 7.5 GHz at crossing 338 to 15 GHz at crossing 332.

According to some embodiments, capacitances 175, 176 and 177 represent a distributive capacitance between the output contact 174 of the circuit and the surface contact 130. According to embodiments, inductors 181 and 184 (e.g., inductor structures 169) are asymmetric inductors that are specifically designed (e.g., can be designed by having selected or predetermined inductance L2 of inductor 181, inductance L1 of inductor 184 (and optionally coefficient K)) to cancel out the parasitic capacitance of this distributed capacitance (e.g., see Zout 224 and loss 324 versus frequency 222 of FIGS. 2-3). According to embodiments, inductors 181 and 184 (e.g., inductor structures 169) are "asymmetric" inductors that are specifically designed to have a selected or predetermined inductance L2 of inductor 181, that is different than (e.g., not equal to) inductance L1 inductor 184.

In some cases, inductors 181 and 184 are asymmetric inductors that are designed to cancel out the parasitic capacitance (e.g., including capacitance 175, 176 and 177) at the output surface contact 130 (e.g., that would be seen or measured "looking into" the surface contact 130), where that capacitance is associated with active devices, resistor templates, ESD diodes, and die bumps of chip 108 that exist in circuit 172 and in the data signal path from that circuit to contact 130 (e.g., see Zout 224 and loss 324 versus frequency 222 of FIGS. 2-3). According to some embodiments, inductors 181 and 184 may be designed (e.g., have inductance L2 and inductance L1 (and optionally coefficient K) selected or predetermined) based on: (1) a (e.g., known) resistance of the circuit seen at the data signal surface contact 130, a (e.g., known) capacitance 175 that represents Cdrv, a (e.g., known) capacitance 176 that represents Cesd, and a (e.g., known) capacitance 177 that represents Cpad to cancel out the parasitic capacitance (e.g., including capacitance 175, 176 and 177) at the output surface contact 130.

In some cases, they are specifically designed to cause the impendance measured at (e.g., looking into) the surface contact 130 to be approximately 50 Ohms and to have zero capacitance or inductance (looking from the compact pad at the driver) at a frequency between 12 and 15 GHz (e.g., see Zout 224 and loss 324 versus frequency 222 of FIGS. 2-3). In some cases, they are designed to cause the impedance to be between 40 and 60 Ohms between 12 and 16 GHz and to have an insertion loss between 0 and −3 dB at a data signal frequency range 8 and 15 GHz (e.g., see Zout 224 and loss 324 versus frequency 222 of FIGS. 2-3).

In some cases, by the nature of inductors 181 and 184 being designed to resonate with (e.g., cancel out) any parallel capacitance sources (e.g., including capacitance 175, 176 and 177) at the output surface contact 130, allow inductor structures 169 to be used in any other matching networks for serial input and/or output (IO) front-end circuits such as data signal transmitters and receivers (e.g., circuit 172). In some cases, inductors 181 and 184 are designed for the purpose of using the inductor structures 169 to extend bandwidth and improve return loss (or reduce reflection) at output surface contact 130 (e.g., that would be seen or measured "looking into" the surface contact 130), when contact 130 is externally connected through die bump, package routes, socket, mother board routes, connectors, and/or cables.

In some cases, inductors 181 and 184; and a bridging capacitance (internal parasitic capacitance of inductors 181 and 184) can be designed (e.g., the inductance L2 of inductor 181, inductance L1 inductor 184, and internal parasitic capacitance of inductors 181 and 184) can be selected or predetermined) to cause parasitic capacitance 175 of circuit 172, capacitance 176 of circuit 178, and parasitic capacitance 177 of contact 130 to be effectively mitigated resulting in extended surface contact bandwidth and reduced reflection (e.g., at or looking into contact 130), ultimately improving signal integrity of the entire serial link system (e.g., data signal channel as describe herein).

According to some embodiments, based on: (1) a (e.g., known) resistance of the circuit seen at the data signal surface contact 130, a (e.g., known) capacitance 175 that represents Cdrv, a (e.g., known) capacitance 176 that represents Cesd, and a (e.g., known) capacitance 177 that represents Cpad, the inductance L2 of the second inductor and inductance L1 of the first inductor (and optionally coefficient K) can be selected (e.g., predetermined or designed): (1) to have the impedance at (e.g., looking into) the contact 130 be approximately between 30 and 70 ohms for an output signal having a frequency between 7.5 and 17 GHZ; and to have an insertion loss of less than 3 dB between approximately 0 and 15 GHZ (e.g., see FIGS. 2-3); and/or (2) to cause inductors 181 and 184 to resonate with/cancel out any parallel capacitance sources (e.g., capacitance 175, 176 and 177) for TO circuits.

FIGS. 4A-D show various levels of IC chip having "on-die" inductor structures to improve signaling between (e.g., from) a data signal output contact of a data signal circuit and (e.g., to) a data signal surface contact of a chip. FIG. 4A-D may show a schematic bottom view of the bottom surface 203 of chip 108 showing components, interconnect features, and/or inductor structures of levels LV2-LV5 that are above bottom surface 203 in a view from the bottom up. It can be appreciated that this view onto the page of the figure is upside down when compared to a top view of the top surface of the chip or a package device upon which the chip is mounted. FIG. 4A-D show IC chip 108 having "on-die" inductor structures 196 on levels LV1-LV5 to improve signaling between (e.g., from) a data signal output contact 174 (e.g., on level LV2) of a data signal (e.g., transmit or receive) circuit 172 (e.g., on level LV2 or above) and (e.g., to) a data signal surface contact 130 (e.g., on surface 203 of level LV1) of chip 108. In some cases, inductors 184 and 181 are each planar inductors having loops or portions of loops on one or more of levels LV2-LV5 of chip 108.

FIGS. 4A-D show chip 108 which has bottom interconnect level LV1 (not shown) with bottom surface 203 (not shown), below last silicon metal layer (LSML) or second level, LV2 level from the bottom of the chip. Level LV2 is below level LV3 of the chip; level LV3 is below level LV4 of the chip, and level LV4 is below level LV5 of the chip. Level LV1 (not shown) may be considered to "bottom" level such as a lower, lowest or exposed level (e.g., a final build-up (BU) layer, BGA, LGA, or die-backend-like layer) of an IC chip, such as chip 108 (e.g., such as microprocessor, coprocessor, graphics processor, memory chip, modem chip, or other microelectronic chip devices) which may be mounted onto (or have mounted onto it) a package device (e.g., a socket, an interposer, a motherboard, or another next-level component).

Figure 4A:
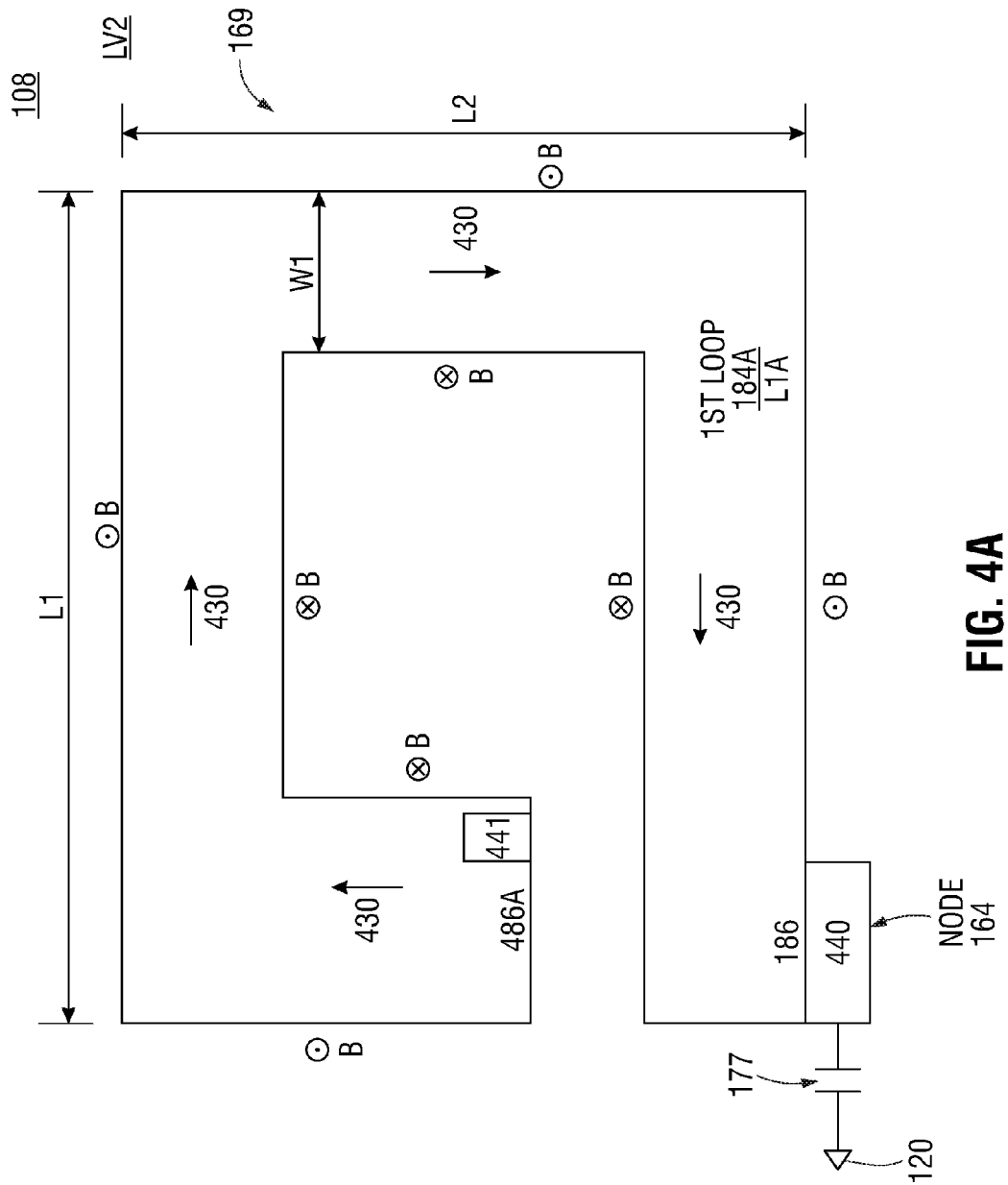
FIGS. 4A-D show various levels of IC chip having "on-die" inductor structures to improve signaling between a data signal output contact of a data signal circuit and a data signal surface contact of a chip.

FIG. 4A show levels LV2 or LSML of IC chip 108 having a portion of "on-die" inductor 184 of structures 169 that improve signaling between (e.g., from) a data signal output contact of a data signal circuit and (e.g., to) a data signal surface contact of a chip. FIG. 4A shows a schematic bottom view of a LSML or LV2 level of chip 108 having a first loop 184A of a first data signal inductor 184 having a first end 186 (e.g., the first end of inductor 184) electrically coupled to (e.g., with less than 10 Ohm resistance) or physically attached to (e.g., touching) node 164.

In some cases, end 186 is electrically coupled to or physically attached to via contact 440 which extends upwards (e.g., extends downwards from a bottom perspective view) to contact 130 on or at exposed horizontal bottom surface 203 of level LV1 of chip 108. Via contact 440 may represent or be one or more via contacts, contacts, traces or other structure as known for connecting a conductive trace (e.g., end 186) to a surface contact (e.g., 130). In some cases, end 186 is electrically coupled to or physically attached through capacitance 177 to ground 120. FIG. 4A shows first loop 184A having a second end 486A opposite end 186 of loop 184A and electrically coupled to or physically attached to via contact 441 which extends downwards (e.g., extend upwards from a bottom perspective view) to loop 184B on or at of level LV3 of chip 108. Via contact 441 may represent or be one or more via contacts, contacts, traces or other structure as known for connecting a conductive trace (e.g., end 486A) to another conductive trace (e.g., end 486B) in another level of a chip.

In some cases, loop 184A may be or include conductor material (e.g., data signal traces) forming more than half or forming 94 percent (e.g., approximately 340 degrees) of a complete or whole loop or circle (e.g., in counterclockwise direction) in level LV2. A complete loop may represent one single loop or circle of structure or shape of conductor material extending 360 around a central axis of the loop (e.g., 360 degrees measured around an axis in a center of a center opening of the loop). Such conductor material may be solid metal (e.g., copper or similar) or alloy trace, wire or other inductor structure as known. Loop 184A may have inductance L1A, which is a portion or fraction of inductance L1. In some cases, L1A is approximately 29 percent of L1.

Loop 184A may create or contribute to magnetic fields or flux B shown going down (e.g., extend upwards from a bottom perspective view) into the page in the center or opening of loop 184A and coming up (e.g., extend below from a bottom perspective view) out of the page beyond the outer perimeter of loop 184A. Flux B may also be caused by or contributed to by other loops of inductor 184 (e.g., 184B, C and D as shown in FIG. 4B) and by loops of inductor 181 (e.g., 184A and B as shown in FIG. 4B).

It can be appreciated that features 440, 441 and 130 may be located on levels other than LV2.

FIG. 4A shows first loop 184A having a data signal transmitted by the data signal circuit 172 flowing in direction 430 (e.g., has positive electrical current moving in direction 430). Data signal direction or current flow 430 for loop 184A is shown initiating at end 486A (e.g., from end 486B, through via contact 441 and to end 486A), flowing clockwise through loop 184A, and exiting through end 186 (e.g., through via contact 440) and to contact 130.

Figure 4B:
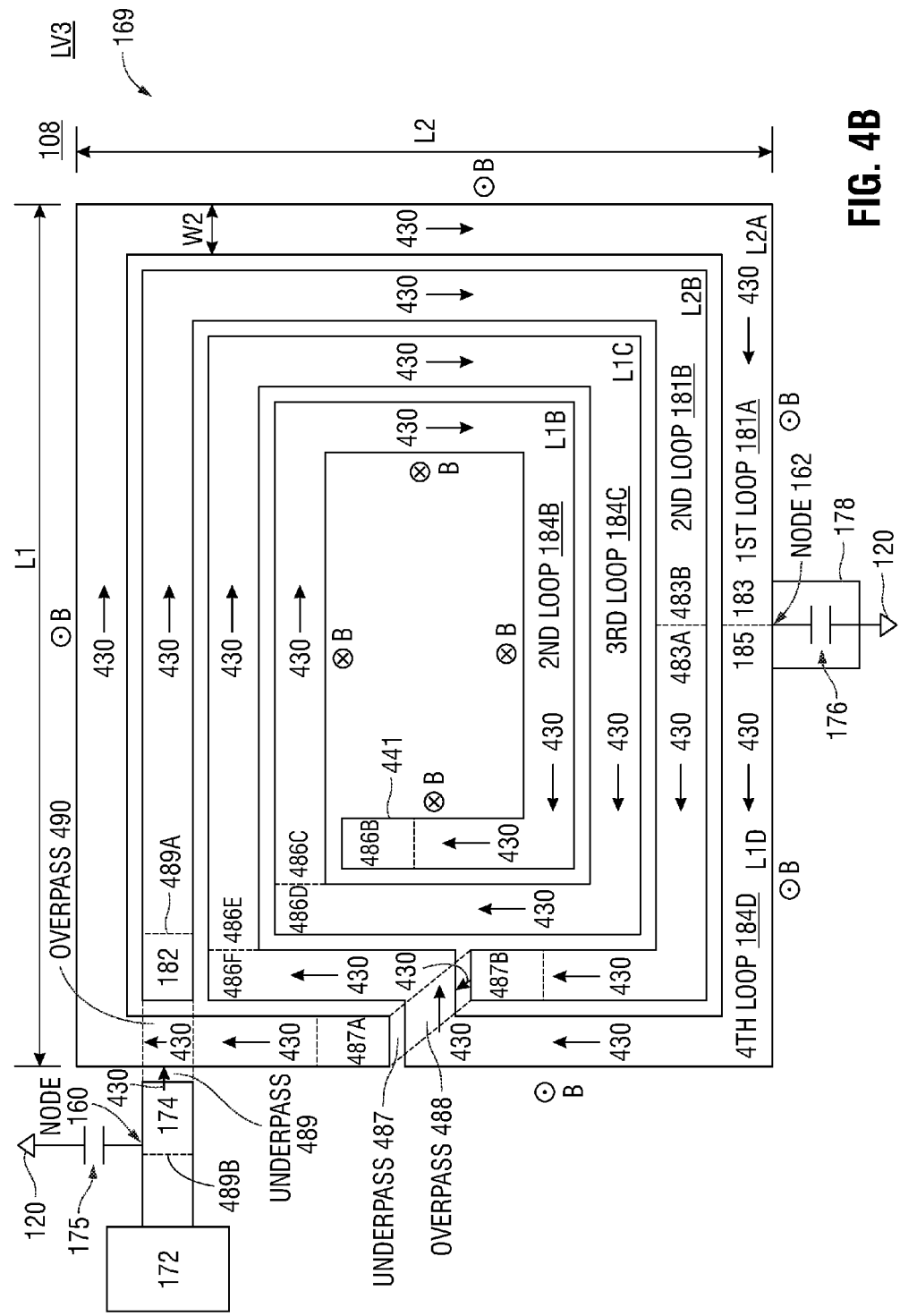

FIG. 4B show levels LV3 or LSML-1 of IC chip 108 having a portion of "on-die" inductors 181 and 184 of structures 169 that improve signaling between (e.g., from) a data signal output contact of a data signal circuit and (e.g., to) a data signal surface contact of a chip. FIG. 4B is a schematic bottom view of level LV3 above level LV2 and having additional loops of the first inductor 184 and loops of a second inductor 181.

FIG. 4B shows second loop 184B of a first data signal inductor 184 having a first end 486B electrically coupled to end 486A (e.g., with less than 10 Ohm resistance) such as by being physically attached through via contact 441. FIG. 4B shows second loop 184B having a second end 486C opposite end 486B of loop 184B and electrically coupled to or physically attached to end 486D of loop 184C.

In some cases, loop 184B may be or include conductor material (e.g., data signal traces) forming a complete or whole loop or circle (e.g., in counterclockwise direction) in level LV3. Loop 184B may have inductance L1B, which is a portion or fraction of inductance L1. In some cases, L1B is approximately 31 percent of L1.

Loop 184B may create magnetic fields or flux B shown going down (e.g., extend upwards from a bottom perspective view) into the page in the center or opening of structure 169 and coming up (e.g., extend below from a bottom perspective view) out of the page beyond the outer perimeter of structure 169. Flux B may also be caused by or contributed to by other loops of inductor 184 (e.g., 184A, C and D as shown in FIGS. 4A-B) and by loops of inductor 181 (e.g., 184A and B as shown in FIG. 4B).

FIG. 4B shows loop 184B having a data signal transmitted by the data signal circuit 172 flowing in direction 430 (e.g., has positive electrical current moving in direction 430). Data signal direction or current flow 430 for loop 184B is shown initiating at end 486C (e.g., from end 486D), flowing clockwise through loop 184B, and exiting through end 486B (e.g., through via contact 441) and to end 486A.

FIG. 4B shows third loop 184C of a first data signal inductor 184 having a first end 486D electrically coupled to or physically attached to (e.g., part of the same trace) end 486C. FIG. 4B shows third loop 184C having a second end 486E opposite end 486D of loop 184C and electrically coupled to or physically attached to (e.g., part of the same trace) end 486F of loop 184D.

In some cases, loop 184C may be or include conductor material (e.g., data signal traces) forming a complete or whole loop or circle (e.g., in counterclockwise direction) in level LV3. Loop 184C may have inductance L1C, which is a portion or fraction of inductance L1. In some cases, L1C is approximately 31 percent of L1.

Loop 184C may create magnetic fields or flux B shown going down (e.g., extend upwards from a bottom perspective view) into the page in the center or opening of structure 169 and coming up (e.g., extend below from a bottom perspective view) out of the page beyond the outer perimeter of structure 169. Flux B may also be caused by or contributed to by other loops of inductor 184 (e.g., 184A, B and D as shown in FIGS. 4A-B) and by loops of inductor 181 (e.g., 184A and B as shown in FIG. 4B).

FIG. 4B shows loop 184C having a data signal transmitted by the data signal circuit 172 flowing in direction 430 (e.g., has positive electrical current moving in direction 430). Data signal direction or current flow 430 for loop 184C is shown initiating at end 468E of loop 184C of inductor 184, flowing clockwise through loop 184C, and exiting through end 486D and to end 486C.

FIG. 4B shows fourth loop 184D of a first data signal inductor 184 having a first end 486F electrically coupled to or physically attached to (e.g., part of the same trace) end 486E. FIG. 4B shows fourth loop 184D having a second end 185 (e.g., the second end of inductor 184) opposite end 486F of loop 184D and electrically coupled to or physically attached to (e.g., part of the same trace) end 183 of loop 181A (e.g., the first end of inductor 181).

In some cases, loop 184D may be or include conductor material (e.g., data signal traces) forming more than on quarter or forming 33 percent (e.g., approximately 120 degrees) of a complete or whole loop or circle (e.g., in counterclockwise direction) in level LV3. Loop 184D may have inductance L1D, which is a portion or fraction of inductance L1. In some cases, L1D is approximately 10 percent of L1.

Loop 184D may create magnetic fields or flux B shown going down (e.g., extend upwards from a bottom perspective view) into the page in the center or opening of structure 169 and coming up (e.g., extend below from a bottom perspective view) out of the page beyond the outer perimeter of structure 169. Flux B may also be caused by or contributed to by other loops of inductor 184 (e.g., 184A, B and C as shown in FIGS. 4A-B) and by loops of inductor 181 (e.g., 184A and B as shown in FIG. 4B).

FIG. 4B shows loop 184D having a data signal transmitted by the data signal circuit 172 flowing in direction 430 (e.g., has positive electrical current moving in direction 430). Data signal direction or current flow 430 for loop 184D is shown initiating at end 185 of loop 184D of inductor 184 (e.g., from end 183 of loop 181A of inductor 181), flowing clockwise through loop 184D, and exiting through end 486F and to end 486E.

Loop 184D is shown having over pass 488 such as where loop 184D and inductor 184 crosses over (e.g., extend below from a bottom perspective view) underpass 487 of loop 181A and inductor 181. Data signal flow direction 430 is shown continuing in the clockwise direction through overpass 488. Overpass 488 and underpass 487 may cause or contribute to the data signal flow direction 430 to be in the same direction for loops of inductors 181 and 184. They may also cause or contribute to the magnetic fields or flux B going down (e.g., extend upwards from a bottom perspective view) into the page in the center or opening of structure 169 and coming up (e.g., extend below from a bottom perspective view) out of the page beyond the outer perimeter of structure 169.

FIG. 4B shows loop 184D of a first data signal inductor 184 having a second end 185 (e.g., the second end of inductor 184) electrically coupled to (e.g., with less than 10 Ohm resistance) or physically attached to (e.g., touching) to node 162.

In some cases, end 185 is electrically coupled to or physically attached to a via contact which extends upwards or downwards (e.g., extends downwards or upwards, respectively, from a bottom perspective view) to ESD circuit 178 on or at another level of chip 108. Such a via contact may represent or be one or more via contacts, contacts, traces or other structure as known for connecting a conductive trace (e.g., end 185) to an ESD circuit (e.g., 178). In some cases, end 185 is electrically coupled to or physically attached through capacitance 176 to ground 120.

FIG. 4B shows first loop 181A of a second data signal inductor 181 having a first end 183 (e.g., the first end of inductor 181) electrically coupled to (e.g., with less than 10 Ohm resistance) or physically attached to (e.g., touching) node 162.

In some cases, end 183 is electrically coupled to or physically attached to a via contact which extends upwards or downwards (e.g., extends downwards or upwards, respectively, from a bottom perspective view) to ESD circuit 178 on or at another level of chip 108. Such a via contact may represent or be one or more via contacts, contacts, traces or other structure as known for connecting a conductive trace (e.g., end 183) to an ESD circuit (e.g., 178). In some cases, end 183 is electrically coupled to or physically attached through capacitance 176 to ground 120.

FIG. 4B shows first loop 181A of a second data signal inductor 181 having a first end 183 (e.g., the first end of inductor 181) electrically coupled to or physically attached to (e.g., part of the same trace) end 185 (e.g., the second end of inductor 184). FIG. 4B shows first loop 181A having a second end 483A opposite end 183 of loop 181A and electrically coupled to or physically attached to (e.g., part of the same trace) end 483B of loop 181B.

In some cases, loop 181A may be or include conductor material (e.g., data signal traces) forming a complete or whole loop or circle (e.g., in counterclockwise direction) in level LV3. Loop 181A may have inductance L2A, which is a portion or fraction of inductance L2. In some cases, L2A is approximately 60 percent of L2.

Loop 181A may create magnetic fields or flux B shown going down (e.g., extend upwards from a bottom perspective view) into the page in the center or opening of structure 169 and coming up (e.g., extend below from a bottom perspective view) out of the page beyond the outer perimeter of structure 169. Flux B may also be caused by or contributed to by loops of inductor 184 (e.g., 184A, B, C and D as shown in FIGS. 4A-B) and by other loops of inductor 181 (e.g., 184B as shown in FIG. 4B).

Loop 181A is shown having over pass 490 such as where loop 181A and inductor 181 crosses over (e.g., extend below from a bottom perspective view) underpass 489 of loop 181B and inductor 181. Data signal flow direction 430 is shown continuing in the clockwise direction through overpass 490. Overpass 490 and underpass 489 may cause or contribute to the data signal flow direction 430 to be in the same direction for loops of inductors 181 and 184. They may also cause or contribute to the magnetic fields or flux B going down (e.g., extend upwards from a bottom perspective view) into the page in the center or opening of structure 169 and coming up (e.g., extend below from a bottom perspective view) out of the page beyond the outer perimeter of structure 169.

FIG. 4B shows loop 181A having a data signal transmitted by the data signal circuit 172 flowing in direction 430 (e.g., has positive electrical current moving in direction 430). Data signal direction or current flow 430 for loop 181A is shown initiating at end 483A of loop 181A of inductor 181, flowing clockwise through loop 181A, and exiting through end 183 of loop 181A of inductor 181 (e.g., through end 183 of loop 181A of inductor 181).

Loop 181A is shown having under pass 487 such as where loop 181A and inductor 181 crosses under (e.g., extend above from a bottom perspective view) overpass 488 of loop 184D and inductor 184. Underpass 487 may include via contacts 487A-B (e.g., see FIGS. 4B-C) and underpass trace or connection 487C (e.g., see FIG. 4D). Data signal flow direction 430 is shown continuing in the clockwise direction through underpass 487. Underpass 487 may cause or contribute to (1) direction 430 being in the same direction for loops of inductors 181 and 184; and (2) magnetic fields or flux B going down (e.g., extend upwards from a bottom perspective view) into the page in the center or opening of structure 169 and coming up (e.g., extend below from a bottom perspective view) out of the page beyond the outer perimeter of structure 169.

FIG. 4B shows second loop 181B of a second data signal inductor 181 having a first end 483B electrically coupled to or physically attached to (e.g., part of the same trace) end 483A. FIG. 4B shows second loop 181B having a second end 182 (e.g., the second end 182 of inductor 181) opposite end 483B of loop 181A and electrically coupled to (e.g., with less than 10 Ohm resistance) or physically attached to (e.g., touching) to underpass 489 (e.g., via contact 489A).

In some cases, loop 181B may be or include conductor material (e.g., data signal traces) forming more than on half or forming 66 percent (e.g., approximately 240 degrees) of a complete or whole loop or circle (e.g., in counterclockwise direction) in level LV3. Loop 181B may have inductance L2B, which is a portion or fraction of inductance L2. In some cases, L2B is approximately 40 percent of L2.

Loop 181B may create magnetic fields or flux B shown going down (e.g., extend upwards from a bottom perspective view) into the page in the center or opening of structure 169 and coming up (e.g., extend below from a bottom perspective view) out of the page beyond the outer perimeter of structure 169. Flux B may also be caused by or contributed to by other loops of inductor 184 (e.g., 184A, B, C and D as shown in FIGS. 4A-B) and by loops of inductor 181 (e.g., 184A as shown in FIG. 4B).

FIG. 4B shows loop 181B having a data signal transmitted by the data signal circuit 172 flowing in direction 430 (e.g., has positive electrical current moving in direction 430). Data signal direction or current flow 430 for loop 181B is shown initiating at end 182 of loop 181B of inductor 181 (e.g., from contact 174 of circuit 172, through underpass 489 and to end 182 of loop 181B), flowing clockwise through loop 181B, and exiting through end 483B and to end 483A.

FIG. 4B shows second loop 181B having a second end 182 (e.g., the second end 182 of inductor 181) opposite end 483B of loop 181A and electrically coupled to (e.g., with less than 10 Ohm resistance) or physically attached to (e.g., touching) to node 160.

Loop 181B is shown having under pass 489 at end 182 such as where loop 181B and inductor 181 crosses under (e.g., extend above from a bottom perspective view) overpass 490 of loop 181A and inductor 181 and is electrically coupled to or physically attached to contact 174. Underpass 489 may include via contacts 489A-B (e.g., see FIGS. 4B-C) and underpass trace or connection 489C (e.g., see FIG. 4D). Data signal flow direction 430 is shown continuing in the clockwise direction through underpass 489. Underpass 489 may cause or contribute to (1) direction 430 being in the same direction for loops of inductors 181 and 184; and (2) magnetic fields or flux B going down (e.g., extend upwards from a bottom perspective view) into the page in the center or opening of structure 169 and coming up (e.g., extend below from a bottom perspective view) out of the page beyond the outer perimeter of structure 169.

In some cases, end 182 is electrically coupled to or physically attached to underpass 489 (e.g., to via contact 489A) which extends under (e.g., extends over from a bottom perspective view) loop 181A to output contact 174 (e.g., of data signal circuit 172) on or at level LV3 of chip 108. In some cases, end 182 is electrically coupled through underpass 489 to output contact 174 (e.g., of data signal circuit 172). In some cases, end 182 is electrically coupled through underpass 489 to capacitance 175 (e.g., at via contact 489B or at contact 174); and through capacitance 175 to ground 120.

FIG. 4B shows contact 174 as part of circuit 172, and circuit 172 on level LV3. However, in some cases, data signal circuit 172 (TX or RX; or both) may disposed on a different horizontal inner level within the chip than contact 174. In such cases, one or more via contacts, contacts, traces or other structure as known for connecting an output contact (e.g., contact 174) to a data signal circuit may be used to electrically couple contact 174 to circuit 172.

Figure 4C:
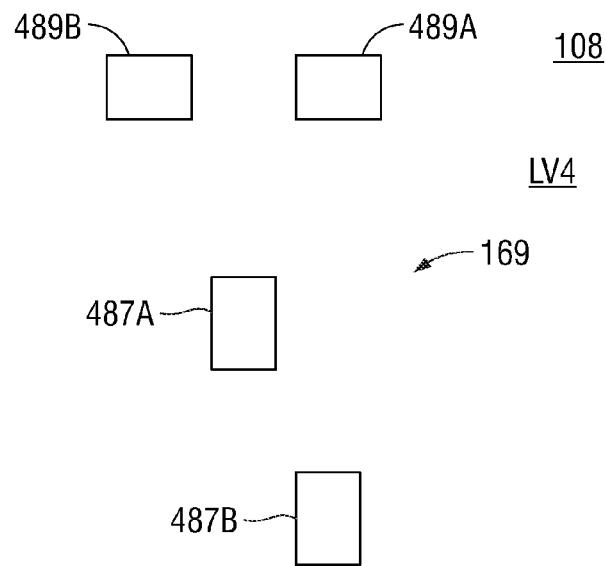

FIG. 4C show level LV4 or LSML-2 of IC chip 108 having a portion of "on-die" inductor 181 of structures 169 that improve signaling between (e.g., from) a data signal output contact of a data signal circuit and (e.g., to) a data signal surface contact of a chip. FIG. 4C shows a schematic bottom view of a level LV4 above level LV3 showing underpass via contacts to underpass connections 487C and 489C for underpasses 487 and 489 of loops of the second inductor 181.

FIG. 4C shows via contacts 487A and B of underpass 487, such as extending downward from level LV3 through LV4 and to level LV5. In some cases, a first location (e.g., discontinuation or end on level LV3) of loop 181A is electrically coupled to or physically attached to via contact 487A which extends downwards (e.g., extend upwards from a bottom perspective view) to a first end of underpass connection 487C on or at of level LV5 of chip 108. Via contact 487A may represent or be one or more via contacts, contacts, traces or other structure as known for connecting a conductive trace (e.g., the first location of loop 181A) to another conductive trace (e.g., first end of underpass connection 487C) in another level (e.g., level LV5) of a chip.

In some cases, a second location (e.g., second discontinuation or end on level LV3) of loop 181A is electrically coupled to or physically attached to via contact 487B which extends downwards (e.g., extend upwards from a bottom perspective view) to a second end of underpass connection 487C on or at of level LV5 of chip 108. Via contact 487B may represent or be one or more via contacts, contacts, traces or other structure as known for connecting a conductive trace (e.g., the second location of loop 181A) to another conductive trace (e.g., second end of underpass connection 487C) in another level (e.g., level LV5) of a chip.

FIG. 4C also shows via contacts 489A and B of underpass 489, such as extending downward from level LV3 through LV4 and to level LV5. In some cases, end 182 of loop 181B is electrically coupled to or physically attached to via contact 489A which extends downwards (e.g., extend upwards from a bottom perspective view) to a first end of underpass connection 489C on or at of level LV5 of chip 108. Via contact 489A may represent or be one or more via contacts, contacts, traces or other structure as known for connecting a conductive trace (e.g., end 182 of loop 181B) to another conductive trace (e.g., first end of underpass connection 489C) in another level (e.g., level LV5) of a chip.

In some cases, contact 174 is electrically coupled to or physically attached to via contact 489B which extends downwards (e.g., extend upwards from a bottom perspective view) to a second end of underpass connection 489C on or at of level LV5 of chip 108. Via contact 489B may represent or be one or more via contacts, contacts, traces or other structure as known for connecting an output contact (e.g., contact 174) to a conductive trace (e.g., second end of underpass connection 489C) in another level (e.g., level LV5) of a chip.

Figure 4D:
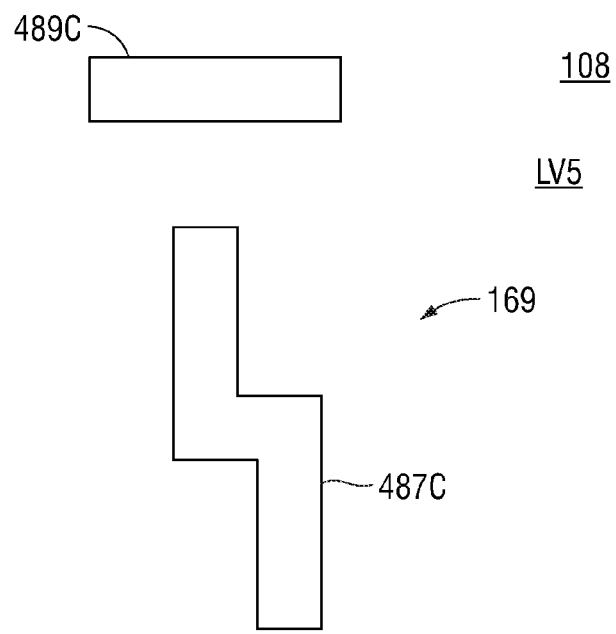

FIG. 4D show level LV5 or LSML-3 of IC chip 108 having a portion of "on-die" inductor 181 of structures 169 that improve signaling between (e.g., from) a data signal output contact of a data signal circuit and (e.g., to) a data signal surface contact of a chip. FIG. 4D shows a schematic bottom view of a level LV5 above level LV4 showing underpass connections 487C and 489C for underpasses 487 and 489 of loops of the second inductor 181.

FIG. 4D shows underpass connection 487C of underpass 487, extending horizontally on or at level LV5; and electrically coupling or physically connecting via contact 487A to 487B. FIG. 4D shows underpass connection 489C of underpass 489, extending horizontally on or at level LV5; and electrically coupling or physically connecting via contact 489A to 489B.

In some cases, a "level" may have two layers, such as a lower main or contact layer; and an upper via layer to connect structures on the lower layer with structures above the via layer. In some cases, levels LV2, LV3, and LV5 are "metal layers" in chip 108, such as layers having metal conductor material structures, contacts and traces for data signal routing. In some cases, levels LV1-LV5 may have via layers between the structure shown in FIGS. 4A-D, such as an upper via layer in levels LV2 and LV3 between the structures shown in FIGS. 4A-D LV2 and LV3. In some cases, level LV4 is a via layer between and for connecting such structures of level LV3 to LV5, such as using via contacts in level LV4. Here, level LV4 may be considered an upper via layer of level LV3 and level LV5 may be considered a fourth layer having metal conductor structures (e.g., LV4')

In some cases, via connection/contact 440 may exists in an upper via layer of level LV1 to connect contact 130 in lower contact layer of level LV1 to end 186 of loop 184A in a lower layer of level LV2. Also, for example, via connection/contact 440 may exists in an upper via layer of level LV2 to connect end 486A of loop 184A in a lower layer of level LV2 to end 486B of loop 184B in a lower layer of level LV3.

According to embodiments, the loops, overpasses, underpasses (e.g., via contacts, connections; and ends of loops), of inductors 181 and 184 may be vertically aligned. In some cases, via contact 440 of loop 184A extends vertically tangential to the planar shape of loop 184A (e.g., tangential to level LV2). In some cases, via contact 441 of loop 184B extends vertically tangential to the planar shape of loop 184B (e.g., tangential to level LV3). In some cases, via contacts 487A, 487B, 489A and 489B of loops 181A and 189B extend vertically tangential to the planar shape of loops 181A and 189B (e.g., tangential to level LV3).

Direction 430 may be in the same direction through the loops of both inductors 181 and 184 (e.g., clockwise). It can be appreciated that for embodiment where circuit 172 is a receiver circuit, direction 430 will be in the opposite direction, but will still be in the same direction through the loops of both inductors 181 and 184 (e.g., counterclockwise).

According to embodiments, by having the inductor loops 184B-D and 181A-B on the same level (e.g., LV3), the coupling coefficient K may be increased, as compared to having those inductor loops on separate levels. According to embodiments, most of the inductor loops of inductor 184 and of inductor 181 are on the same level (e.g., LV3), to increase the coupling coefficient K, as compared to having the inductor loops on separate levels. In some cases, each of inductors 181 and 184 may have their loops disposed on only two levels above level LV1. In some cases they use two consecutive levels LV1, LV2 or LV3, LV4, or LV4, LV5.

In some cases, one or more underpasses may be used by loops of a first of inductor 184 and/or of inductor 181 to "jump across" loops of the other inductor in order for the first inductors signal direction to cross a path of loops of the other inductor.

In some cases, one loop (or more or less) of inductor 184 may exist at a bottom metal, LSML, LV2 level, extending from a via contact to the surface contact, and looping to a via contact to the LV3 level. From the via contact, inductor 184 may continue in multiple loops on the LV3 level. It may contact the ESD circuit using a via contact and/or ESD trace on the LV3 level. One of the loops of inductor 184 may be transitioned or jumped by the underpass of the inductor 181.

According to embodiments, the parts of structure 169 (e.g., loops of inductors 184 and 181) on level LV5 may have a chip or silicon design rule that is smaller than the parts of structure 169 (e.g., loops of inductors 184 and 181) on levels LV3 and LV4 which may have a on-die interconnect feature design rule which may be smaller than the structure on level LV2 which may have a surface contact or package design rule.

In some cases, there may be isolation structures, such as isolation (e.g., power and/or ground signal) traces, interconnect features, circuit output contacts, surface contacts, package traces, and/or channels between chips, between each adjacent pair of data signal traces, data signal interconnect features, data signal circuit output contacts, data signal surface contacts, package data signal traces, and/or data signal channels between chips.

FIGS. 4A-B show length L1 as a left to right length along level LV2 of loop 184A, and length L2 as a top to bottom length along level LV2 of loop 184A. In some cases, length L1 is between 30 and 60 micrometers (um) and length L2 is between 20 and 50 um. In some cases, length L1 is between 40 and 50 micrometers (um) and length L2 is between 30 and 42 um. In some cases, length L1 is between 42 and 47 micrometers (um) and length L2 is between 34 and 38 um.

FIGS. 4A-B show width W1 as a width along level LV2 of loop 184A, and width W2 as width of loops 184B-D and 181A-B along level LV3. In some cases, width W1 is between 2 and 10 um. In some cases it is between 3 and 8 um. In some cases it is between 4.5 and 6.5 um. In some cases, width W2 is between 0.5 and 5 um. In some cases it is between 1 and 3 um. In some cases it is between 1.5 and 2.5 um. According to embodiments, loop 184A has vertical height H1 (not shown) as it extends horizontally along level LV2 (e.g., extending in a direction between level LV1 and LV3), and loops 184B-D and 181A-B have vertical height H2 (not shown) as they extends horizontally along level LV3 (e.g., extending in a direction between level LV2 and LV4). In some cases, heights H1 and H2 are between 1 and 8 um. In some cases they are between 4 and 8 um. In some cases they are between 5 and 7 um. In some cases they are each between 0.1 and 1 um. In some cases they are between 1 and 4 um. In some cases they are between 4 and 15 um.

According to embodiments, the structure 169 (e.g., loops of inductors 184 and 181) have or exhibit a total inductance of between 600 and 900 pH; a coupling factor (e.g., K) of between 0.5 and 0.7 at a data speed of 20 GHz; and a quality factor of between 3.5 and 5.5 at a data speed of 20 GHz. In some cases, they have or exhibit a total inductance of between 700 and 800 pH; a coupling factor (e.g., K) of between 0.55 and 0.65 at a data speed of 20 GHz; and a quality factor of between 4 and 5 at a data speed of 20 GHz. In some cases, they have or exhibit a total inductance of approximately 750 pH, a coupling factor (e.g., K) of approximately 0.6 at a data speed of 20 GHz, and a quality factor of approximately 4.5 at a data speed of 20 GHz.

Chip 108 is shown having bottom surface 203, such as a bottom exposed surface of dielectric, upon or in which may be formed (e.g., disposed) contacts 130, such as in an area. In some cases, contacts 130 may be described as a signal cluster formed in a lengthwise 4-row deep die-bump pattern.

In some embodiments, computing system 100 may be part of a system for routing signals from a version of chip 108 (e.g., including IC chip "on-die" inductor structures 169) having TX circuit 172, through a package device, and to another version of chip 108 (e.g., including IC chip "on-die" inductor structures 169) having RX circuit 172 in order to achieve improved signal connections and transmission through a package device.

In some cases, system 100 has the version of chip 108 having TX circuit 172 mounted on a package device at first location; and the version of chip 108 having RX circuit 172 mounted on the same package device at second location (or a different if the two package devices have data channels formed through them). In some cases, system 100 includes the version of chip 108 having TX circuit 172, solder bumps physically attaching that chip to a package device at first location, the version of chip 108 having RX circuit 172, and solder bumps physically attaching that chip to a package device at second location, such as forming data signal transmit channels from the TX circuits to the RX circuits. The package device may also be mounted on a package, an interposer or a patch. For example, a bottom surface of the package device may in turn be mounted on an interposer or patch using solder bumps or BGAs.

According to embodiments chip 108 may be an IC chip such as microprocessor, coprocessor, graphics processor, memory chip, modem chip, or other microelectronic chip devices. According to embodiments chip 108 may be an IC chip capable of being mounted or directly attached onto a socket, an interposer, a motherboard, or another next-level component (e.g., a package device). In some cases, a package device may represent a substrate package, an interposer, a printed circuit board (PCB), a PCB an interposer, a "package", a socket, an interposer, a motherboard, or another substrate upon which integrated circuit (IC) chips or other package devices may be attached (e.g., such as microprocessor, coprocessor, graphics processor, memory chip, modem chip, or other microelectronic chip devices) (e.g., chip 108).

FIGS. 1-4 show chip 108 having chip "on-die" inductor structures 196 in levels LV2-LV5. Such levels and inductor structures 169 as described herein may be considered a three dimensional part or portion of an IC chip. Such levels may include various active and passive circuitry; traces; interconnects and/or other structure know to be on an IC chip. FIGS. 1-4 show chip 108 having chip "on-die" inductor structures 196 in levels LV2-LV5. In some cases, chip 108 includes levels above level LV5. These levels may include various active and passive circuitry; traces; interconnects and/or other structure know to be on an IC chip. According to embodiments, chip 108 may include (e.g., on one or more levels above level L2 or above level L5) active microprocessor circuitry and/or hardware logic (e.g., solid state hardware) such as microprocessor processing logic, memory, cache, gates, transistors (e.g., metal oxide semiconductor (MOS) field effect transistor (FET), fin FET and the like) as known to be on or part of an IC chip such as a central processing unit (CPU), microprocessor, coprocessor, graphics processor, memory chip, modem chip, or other microelectronic chip devices. A portion of such circuitry and/or logic may by electrically coupled or physically attached to circuits 172 (e.g., transistors 171) and 178. According to embodiments, chip 108 may include (e.g., on one or more levels above level L2 or L5) active microprocessor circuitry and/or hardware logic of a multipurpose, clock driven, register based, programmable electronic device which accepts digital or binary data as input (e.g., at contact 130 of a channel having circuit 172 and an RX data signal circuit), processes it according to instructions stored in its memory, and provides results as output (e.g., at contact 130 of a channel having circuit 172 and a TX data signal circuit). According to embodiments, chip 108 may contain both combinational logic and sequential digital logic; and may operate on numbers and symbols represented in the binary numeral system.

In some cases, the use of "level" describes a "layer" of material (e.g., dielectric and/or conductive material) of a chip as known. In some cases, the use of a top, bottom, and/or last silicon metal "level" describes a top, bottom, and/or last silicon metal "layer" of material (e.g., dielectric and/or conductive material) of a chip as known. In some cases, a "level" may have two layers, such as a lower main or contact layer; and an upper via layer to connect structures on the lower layer with structures above the via layer.

FIGS. 1-4 show chip 108 having chip "on-die" inductor structures 196 in levels LV2-LV5. In some cases, only dielectric material (in some cases shown by blank areas of figures not having labeled or named features) fills in any space between (e.g., above, below, and beside such as in the length, width and height directions) the chip on-die inductor structures 196 in levels LV2-LV5. In some cases, dielectric material and various active and passive circuitry; traces; interconnects and/or other structure know to be on an IC chip fill in any space between, but do not interfere with the electrical function of the chip on-die inductor structures 196 in levels LV2-LV5. In some cases, filling in the space between the interconnect features includes existing in any space where those features do not exist, and are not physically attached to (e.g., are not touching) each other. In some cases, filling in the space between the interconnect features includes separating each and all of those features except where they are coupled or physically attached to each other.

In some cases the data signal transmit signals described herein are high frequency (HF) data signals (e.g., TX data signals). In some cases, the signals have a speed of between 4 and 10 gigatransfers per second (GT/s). In some cases, the signals have a speed of between 6 and 8 gigatransfers per second. In some cases, the signals have a speed of between 4 and 5 Gigabits per second. In some cases, the speed is between 4 and 4.5 Gigabits per second. In some cases, the signals have a speed of between 2 and 12 Gigabits per second. In some cases, the signals have a speed of between 3 and 12 Giga-Transfers per second. In some cases the signals have a speed between 7 and 25 GT/s; and a voltage of between 0.5 and 2.0 volts. In some cases the signal has a speed between 6 and 15 GT/s. In some cases the signal has a voltage of between 0.4 and 5.0 volts. In some cases it is between 0.5 and 2.0 volts. In some cases it is a different speed and/or voltage level that is appropriate for receiving or transmitting data signals through or within a package device. In some cases, they are in a range between a very low speed transfer rate such as from 50 MT/s to greater than 40 GT/s (or up to between 40 and 50 GT/s). In some cases, the speeds above are a data rate or data transfer rate of how many bit can be transferred in 1 second at a single wire or an input or output (TO) wire, channel or trace.

In some cases the ground signals described herein is a zero voltage direct current (DC) grounding signal (e.g., GND). In some cases the ground signal has a voltage of between 0.0 and 0.2 volts. In some cases it is a different but grounding voltage level for providing electrical ground signals through (or within) a package device or IC chip.

In some cases, the use of "approximately" describes exactly that number. In some cases, the use of "approximately" describes within 10 percent above and below that number. In some cases, the use of "approximately" describes within 5 percent above and below that number. In some cases, the use of "approximately" describes within 2 percent above and below that number.

In some embodiments, surface contacts 130 (optional features 140); output contact 174; inductors 184 and 181; via contacts 440 and 441; inductor loops 184A-D and 181A-B; underpass via contacts 487A, 487B, 489A and 498B; underpass connections 487C and 489C; and overpass 488 and 490 (e.g., parts of loops 184D and 181A respectively) are formed of a solid conductive (e.g., pure conductor) material. In some cases, they may each be a height (e.g., a thickness), width and length (such as shown and described herein) of solid conductor material.

In some cases, the conductive (e.g., conductor) material may be a pure conductor (e.g., a metal or pure conductive material). Such material may be or include copper (Cu), gold, silver, bronze, nickel, silver, aluminum, molybdenum, an alloy, or the like as known for such a contact. In some cases, they are all copper. In some cases, they all include copper and may include one or more other metals.

Layers of dielectric or dielectric material (in some cases shown by blank areas of figures not having labeled or named features) may each be a height (e.g., a thickness), width and length of solid non-conductive material. The dielectric material may be a pure non-conductor (e.g., an oxide or pure non-conductive material). Such material may be or include silicon nitride, silicon dioxide, porcelain, glass, plastic, or the like as known for such a dielectric. In some cases it is silicon nitride. In some cases, it is a pure oxide, non-conductive material.

In some cases, the on-die inductor structures 169 (e.g., inductors 184 and 181) may increase in the stability and cleanliness of high frequency transmit and receive data signals transmitted between the data signal circuits of two chips communicating though a package device upon which they are mounted (e.g., as compared to a data signal transmitting and/or receiving chip without the on-die inductor structures). Such an increased frequency may include data signals having a frequency of between 7 and 25 gigatransfers per second (GT/s). In some cases, GT/s may refer to a number of operations (e.g., transmission of digital data such as the data signal herein) transferring data that occur in each second in some given data transfer channel such as a channel provided by the on-die inductor structures; or may refer to a sample rate, i.e. the number of data samples captured per second, each sample normally occurring at the clock edge. 1 GT/s is $10^9$ or one billion transfers per second. In some cases, the on-die interconnection features improves (e.g., reduce) crosstalk (e.g., as compared to a data signal transmitting and/or receiving chip without the on-die interconnection features) from very low frequency transfer such as from 50 mega hertz (MHz) to a GHz transfer level, such as greater than 40 GHz (or up to between 40 and 50 GHz).

In some cases, the on-die inductor structures 169 (e.g., inductors 184 and 181) are formed using processes or processing as know in the industry for forming traces, interconnects, via contact and surface contacts of an IC chip or die. In some cases, forming them includes using masking and etching of a silicon wafer. In some cases, the masking includes masking with a solder resist and etching dielectric and/or conductor material.

In some cases, forming them includes using chemical vapor deposition (CVD); atomic layer deposition (ALD); growing dielectric material such as from or on a surface having a pattern of dielectric material and conductor material. In some cases, forming them includes patterning a mask using photolithography. In some cases, the mask may be liquid photoimageable "wet" mask or a dry film photoimageable "dry" mask blanket layer sprayed onto the surface; and then masked and exposed to a pattern of light (e.g., the mask is exposed to light where a template of the pattern placed over the mask does not block the light) and developed to form openings where the features will exists. Depending on the mask type, the exposed or unexposed areas are removed. In some cases, the mask goes through a thermal cure of some type after the openings (e.g., pattern) are defined. In some cases, the mask may be formed by a process known to form such a mask of a chip, or device formed using IC chip processing.

In some cases, embodiments of processes for forming chips having on-die inductor structures 169 (e.g., inductors 184 and 181) provide the benefits embodied in computer system architecture features and interfaces made in high volumes. In some cases, embodiments of such processes and devices provide all the benefits of solving very high frequency data transfer interconnect problems, such as between two IC chips or die (e.g., where hundreds even thousands of signals between two die need to be routed), or for high frequency data transfer interconnection within a system on a chip (SoC) (e.g., see FIG. 1). In some cases, embodiments of such processes and devices provide the demanded lower cost high frequency data transfer interconnects solution that is needed across the above segments. These benefits may be due to the addition of on-die inductor structures 169 (e.g., inductors 184 and 181) which increase performance and speed of the data transfer.

Figure 5:
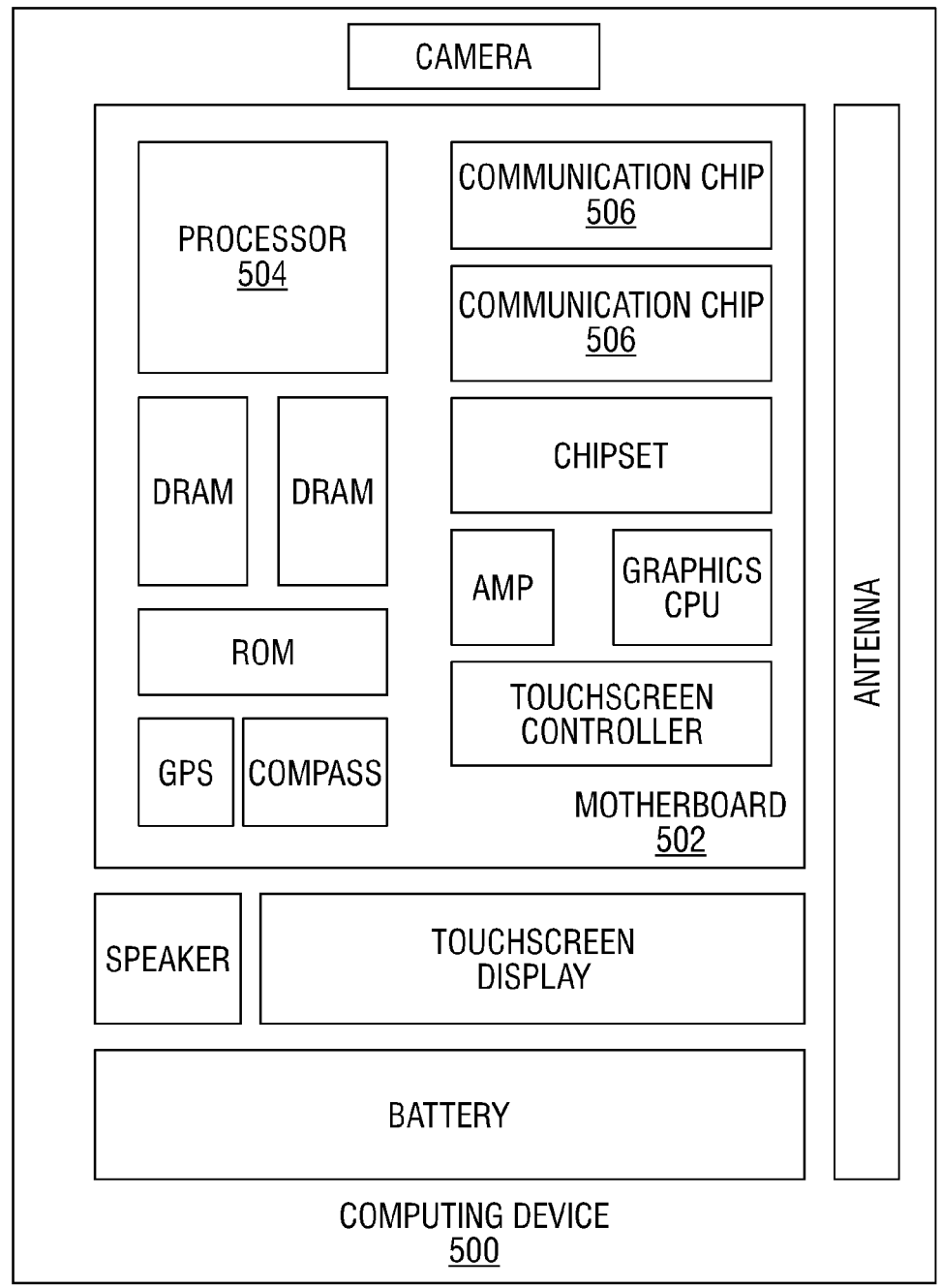
FIG. 5 illustrates a computing device in accordance with one implementation.

FIG. 5 illustrates a computing device in accordance with one implementation. FIG. 5 illustrates computing device 500 in accordance with one implementation. Computing device 500 houses board 502. Board 502 may include a number of components, including but not limited to processor 504 and at least one communication chip 506. Processor 504 is physically and electrically coupled to board 502. In some implementations at least one communication chip 506 is also physically and electrically coupled to board 502. In further implementations, communication chip 506 is part of processor 504.

Depending on its applications, computing device 500 may include other components that may or may not be physically and electrically coupled to board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, first communication chip 506 may be dedicated to shorter range wireless communications such as Wi-Fi and Bluetooth and second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. In some implementations, the integrated circuit die of the processor includes one or more devices, such as transistors or metal interconnects. In some embodiments, the package of the integrated circuit die or processor 504 includes embodiments of processes for forming "on-die inductor structures 169 (e.g., inductors 184 and 181)" or embodiments of "on-die inductor structures 169 (e.g., inductors 184 and 181)" as described herein. The term "processor" may refer to any device or portion of a device that processes electronic data from registers and/or memory to transform that electronic data into other electronic data that may be stored in registers and/or memory.

Communication chip 506 also includes an integrated circuit die packaged within communication chip 506. In accordance with another implementation, the integrated circuit die of the communication chip includes one or more devices, such as transistors or metal interconnects. In some embodiments, the package of the integrated circuit die or chip 506 includes embodiments of processes for forming "on-die inductor structures 169 (e.g., inductors 184 and 181)" or embodiments of "on-die inductor structures 169 (e.g., inductors 184 and 181)" as described herein.

In further implementations, another component housed within computing device 500 may contain an integrated circuit die that includes one or more devices, such as transistors or metal interconnects. In some embodiments, the package of the other integrated circuit die or chip includes embodiments of processes for forming "on-die inductor structures 169 (e.g., inductors 184 and 181)" or embodiments of "on-die inductor structures 169 (e.g., inductors 184 and 181)" as described herein.

In various implementations, computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 500 may be any other electronic device that processes data.

EXAMPLES

Example 1 is an integrated circuit (IC) chip comprising: a data signal circuit disposed on a horizontal inner layer within the chip and having a data signal output contact; a data signal surface contact disposed on a horizontal surface of the chip; a first data signal inductor having (1) a second end electrically coupled to a capacitance value of an electrostatic discharge (ESD) circuit and to the electrostatic discharge (ESD) circuit, and (2) a first end electrically coupled to a capacitance value at the data signal surface contact and to the data signal surface contact; and a second data signal inductor having (1) a second end electrically coupled to the data signal output contact of the data signal circuit, and to a capacitance value of the data signal circuit, (2) a first end electrically coupled to the second end of the first data signal inductor, and to the capacitance value of the ESD circuit.

In Example 2, the subject matter of Example 1 can optionally include wherein the second and first inductors are located and electrically coupled to the data signal surface contact, ESD circuit and data signal circuit so that a data signal transmitted by the data signal circuit flows in the same direction through the loops of the first and second inductors.

In Example 3, the subject matter of Example 1 can optionally include wherein the second and first inductors are located and electrically coupled to the data signal surface contact, ESD circuit and data signal circuit so that a magnetic field produced by the second inductor when the data signal is output by the data signal circuit towards the data signal circuit output, causes a magnetic field proportional to the data signal output by a coupling coefficient amount K, to be received by the first capacitor.

In Example 4, the subject matter of Example 1 can optionally include wherein the EDS circuit is electrically coupled between second end of first inductor and ground; the capacitance value at a data signal surface contact is between the first end of the first inductor and ground; and the capacitance value of the data signal circuit is between the data signal output contact and ground.

In Example 5, the subject matter of Example 1 can optionally include wherein, based on the capacitance value at the data signal surface contact, the capacitance value of the data signal circuit, and the capacitance value of the ESD circuit, and a second inductance of the second inductor and a first inductance of the first inductor are selected: (1) to have the impedance at the data signal surface contact be approximately between 30 and 70 Ohms for an output signal having a frequency between 7.5 and 17 GHZ; and (2) to have an insertion loss of less than 3 dB between approximately 0 and 15 GHZ.

In Example 6, the subject matter of Example 1 can optionally include wherein, based on the capacitance value at the data signal surface contact, the capacitance value of the data signal circuit, and the capacitance value of the ESD circuit, and a second inductance of the second inductor and a first inductance of the first inductor are selected to cause the second and first inductor to cancel out any parallel capacitance of the capacitance value at the data signal surface contact, the capacitance value of the data signal circuit, and the capacitance value of the ESD circuit.

In Example 7, the subject matter of Example 1 can optionally include wherein loops of the first inductor are disposed within a last silicon metal level LSML and a LSML-1 level of the chip; and wherein loops of the second inductor are disposed within the LSML-1 level of the chip.

In Example 8, the subject matter of Example 1 can optionally include wherein loops of the first inductor cross on different levels of the chip with loops of the second inductor so that a data signal transmitted by the data signal circuit flows in the same direction through the loops of the first and second inductors.

In Example 9, the subject matter of Example 1 can optionally include wherein loops of the first inductor cross on different levels of the chip with loops of the second inductor so that a magnetic field produced by the second inductor when the data signal is output by the data signal circuit towards the data signal circuit output, causes a magnetic field proportional to the data signal output by a coupling coefficient amount K, to be received by the first capacitor.

In Example 10, the subject matter of Example 1 can optionally include wherein the data signal circuit is a data signal transmit circuit capable of transmitting a data signal having a speed of between 7 and 25 GT/s.

In Example 11, the subject matter of Example 1 can optionally include wherein the data signal circuit is a data signal receive circuit capable of receiving a data signal having a speed of between 7 and 25 GT/s.

Example 12 is an integrated circuit (IC) chip comprising: a data signal circuit disposed on a horizontal inner layer within the chip and having a data signal output contact; a data signal surface contact disposed on a horizontal surface of the chip; a first data signal inductor having (1) a second end electrically coupled to a capacitance value of an electrostatic discharge (ESD) circuit and to the electrostatic discharge (ESD) circuit, and (2) a first end electrically coupled to a capacitance value at the data signal surface contact and to the data signal surface contact; and a second data signal inductor having (1) a second end electrically coupled to the data signal output contact of the data signal circuit, and to a capacitance value of the data signal circuit, (2) a first end electrically coupled to the second end of the first data signal inductor, and to the capacitance value of the ESD circuit, wherein the second and first inductors are located and electrically coupled to the data signal surface contact, ESD circuit and data signal circuit so that a magnetic field produced by the second inductor when the data signal is output by the data signal circuit towards the data signal circuit output, causes a magnetic field proportional to the data signal output by a coupling coefficient amount K, to be received by the first capacitor.

In Example 13, the subject matter of Example 12, can optionally include wherein the second and first inductors are located and electrically coupled to the data signal surface contact, ESD circuit and data signal circuit so that a data signal transmitted by the data signal circuit flows in the same direction through the loops of the first and second inductors.

In Example 14, the subject matter of Example 12, can optionally include wherein the EDS circuit is electrically coupled between second end of first inductor and ground; the capacitance value at a data signal surface contact is between the first end of the first inductor and ground; and the capacitance value of the data signal circuit is between the data signal output contact and ground.

Example 15 is an electronic system comprising: a first integrated circuit chip having: a data signal transmitter circuit disposed on a horizontal inner layer within the first chip and having a data signal output contact of the first chip; a data signal surface contact disposed on a horizontal surface of the first chip; a first data signal inductor of the first chip having (1) a second end electrically coupled to a capacitance value of an electrostatic discharge (ESD) circuit of the first chip, and (2) a first end electrically coupled to a capacitance value at the data signal surface contact and to the data signal surface contact of the first chip; and a second data signal inductor of the first chip having (1) a second end electrically coupled to the data signal output contact of the data signal circuit of the first chip, and to a capacitance value of the data signal circuit of the first chip, (2) a first end electrically coupled to a second end of the first data signal inductor of the first chip, and to the capacitance value of the ESD circuit of the first chip; a second integrated circuit chip having: a data signal receiver circuit disposed on a horizontal inner layer within the second chip and having a data signal output contact of the second chip; a data signal surface contact disposed on a horizontal surface of the second chip and electrically coupled to the data signal output contact of the second chip; and a chip package electrically coupling the data signal surface contact of the first chip to the data signal surface contact of the second chip.

In Example 16, the subject matter of Example 15 can optionally include wherein the second integrated circuit chip further comprises: a first data signal inductor of the second chip having (1) a second end electrically coupled to a capacitance value of an electrostatic discharge (ESD) circuit of the second chip, and (2) a first end electrically coupled to a capacitance value at the data signal surface contact and to the data signal surface contact of the second chip; and a second data signal inductor of the second chip having (1) a second end electrically coupled to the data signal output contact of the data signal circuit of the second chip, and to a capacitance value of the data signal circuit of the second chip, (2) a first end electrically coupled to a second end of the first data signal inductor of the second chip, and to the capacitance value of the ESD circuit of the second chip.

In Example 17, the subject matter of Example 16 can optionally include wherein the second and first inductors of the first and second chips are located and electrically coupled to the data signal surface contacts, ESD circuits and data signal circuits of the first and second chips so that a data signal transmitted by the data signal circuit of the first chips flows in the same direction through the loops of the first and second inductors of the first and second chips.

In Example 18, the subject matter of Example 16 can optionally include wherein the second and first inductors of the first and second chips are located and electrically coupled to the data signal surface contacts, ESD circuits and data signal circuits of the first and second chips so that a magnetic field produced by the second inductor of the first and second chips when a data signal is output by the data signal transmit circuit of the first chip causes a magnetic field proportional to the data signal output by a coupling coefficient amount K, to be received by the first capacitor of the first and second chips.

In Example 19, the subject matter of Example 16 can optionally include wherein, based on the capacitance value at the data signal surface contact of the first and second chips, the capacitance value of the data signal circuit of the first and second chips, and the capacitance value of the ESD circuit of the first and second chips, and a second inductance of the second inductor of the first and second chips, and a first inductance of the first inductor of the first and second chips are selected: (1) to have the impedance at the data signal surface contact of the first and second chips be approximately between 30 and 70 Ohms for an output signal having a frequency between 7.5 and 17 GHZ; and (2) to have an insertion loss of the first and second chips of less than 3 dB between approximately 0 and 15 GHZ.

In Example 20, the subject matter of Example 16 can optionally include wherein, based on the capacitance value at the data signal surface contact of the first and second chips, the capacitance value of the data signal circuit of the first and second chips, and the capacitance value of the ESD circuit of the first and second chips, and a second inductance of the second inductor of the first and second chips, and a first inductance of the first inductor of the first and second chips are selected to cause the second and first inductor of the first and second chips to cancel out any parallel capacitance of the capacitance value at the data signal surface contact of the first and second chips, the capacitance value of the data signal circuit of the first and second chips, and the capacitance value of the ESD circuit of the first and second chips.

In Example 21, the subject matter of Example 16 can optionally include wherein loops of the first inductor of the first and second chips are disposed within a last silicon metal level LSML and a LSML-1 level of the chip; and wherein loops of the second inductor of the first and second chips are disposed within the LSML-1 level of the chip.

In Example 22, the subject matter of Example 16 can optionally include wherein loops of the first inductor of the first and second chips cross on different levels of the chip of the first and second chips with loops of the second inductor of the first and second chips so that a data signal transmitted by the data signal transmit circuit flow in the same direction through the loops of the first and second inductors of the first and second chips.

In Example 23, the subject matter of Example 16 can optionally include wherein loops of the first inductor of the first and second chips cross on different levels of the chip of the first and second chips with loops of the second inductor of the first and second chips so that a magnetic field produced by the second inductor of the first and second chips when the data signal is output by the data signal transmit circuit causes a magnetic field proportional to the data signal output by a coupling coefficient amount K, to be received by the first capacitor of the first and second chips.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize. These modifications may be made to the invention in light of the above detailed description. For example, although some embodiments described above show only on-die inductor structures 169 (e.g., inductors 184 and 181) at levels LV2-LV5, those descriptions can apply to forming or having those same on-die inductor structures 169 (e.g., inductors 184 and 181) at levels LV3-LV6 (e.g., one level above where the features are shown). The terms used in the following claims should not be construed to limit the invention to the specific implementations disclosed in the specification and the claims. Rather, the scope is to be determined entirely by the following claims, which are to be construed in accordance with established doctrines of claim interpretation.

The invention claimed is:
1. An integrated circuit (IC) chip comprising:
a data signal circuit disposed on a horizontal inner layer within the chip and having a data signal output contact;
a data signal surface contact disposed on a horizontal surface of the chip;
a first data signal inductor having (1) a second end electrically coupled to a capacitance value of an electrostatic discharge (ESD) circuit and to the electrostatic discharge (ESD) circuit, and (2) a first end electrically coupled to a capacitance value at the data signal surface contact and to the data signal surface contact; and
a second data signal inductor having (1) a second end electrically coupled to the data signal output contact of the data signal circuit, and to a capacitance value of the data signal circuit, (2) a first end electrically coupled to the second end of the first data signal inductor, and to the capacitance value of the ESD circuit, wherein loops of the first data signal inductor are disposed within a last silicon metal level LSML and a LSML-1 level of the chip, and wherein loops of the second data signal inductor are disposed within the LSML-1 level of the chip.
2. The chip of claim 1, wherein the second and first data signal inductors are located and electrically coupled to the data signal surface contact, ESD circuit and data signal circuit so that a data signal transmitted by the data signal circuit flows in the same direction through the loops of the first and second inductors.

3. The chip of claim 1, wherein the second and first data signal inductors are located and electrically coupled to the data signal surface contact, ESD circuit and data signal circuit so that a magnetic field produced by the second data signal inductor when the data signal is output by the data signal circuit towards the data signal circuit output, causes a magnetic field proportional to the data signal output by a coupling coefficient amount K, to be received by the first data signal inductor.

4. The chip of claim 1, wherein the ESD circuit is electrically coupled between second end of first data signal inductor and ground; the capacitance value at a data signal surface contact is between the first end of the first data signal inductor and ground; and the capacitance value of the data signal circuit is between the data signal output contact and ground.

5. The chip of claim 1, wherein, based on the capacitance value at the data signal surface contact, the capacitance value of the data signal circuit, and the capacitance value of the ESD circuit,
   a second inductance of the second data signal inductor and a first inductance of the first data signal inductor are selected: (1) to have the impedance at the data signal surface contact be approximately between 30 and 70 Ohms for an output signal having a frequency between 7.5 and 17 GHZ; and (2) to have an insertion loss of less than 3 dB between approximately 0 and 15 GHZ.

6. The chip of claim 1 wherein, based on the capacitance value at the data signal surface contact, the capacitance value of the data signal circuit, and the capacitance value of the ESD circuit,
   a second inductance of the second data signal inductor and a first inductance of the first data signal inductor are selected to cause the second and first data signal inductors to cancel out any parallel capacitance of the capacitance value at the data signal surface contact, the capacitance value of the data signal circuit, and the capacitance value of the ESD circuit.

7. The chip of claim 1, wherein loops of the first data signal inductor cross on different levels of the chip with loops of the second data signal inductor so that a data signal transmitted by the data signal circuit flows in the same direction through the loops of the first and second data signal inductors.

8. The chip of claim 1, wherein loops of the first data signal inductor cross on different levels of the chip with loops of the second data signal inductor so that a magnetic field produced by the second data signal inductor when the data signal is output by the data signal circuit towards the data signal circuit output, causes a magnetic field proportional to the data signal output by a coupling coefficient amount K, to be received by the first data signal inductor.

9. The chip of claim 1, wherein the data signal circuit is a data signal transmit circuit capable of transmitting a data signal having a speed of between 7 and 25 GT/s.

10. The chip of claim 1, wherein the data signal circuit is a data signal receive circuit capable of receiving a data signal having a speed of between 7 and 25 GT/s.

11. An electronic system comprising:
   a first integrated circuit chip having:
      a data signal transmitter circuit disposed on a horizontal inner layer within the first chip and having a data signal output contact of the first chip;
      a data signal surface contact disposed on a horizontal surface of the first chip;
      a first data signal inductor of the first chip having (1) a second end electrically coupled to a capacitance value of an electrostatic discharge (ESD) circuit of the first chip, and (2) a first end electrically coupled to a capacitance value at the data signal surface contact and to the data signal surface contact of the first chip; and
      a second data signal inductor of the first chip having (1) a second end electrically coupled to the data signal output contact of the data signal circuit of the first chip, and to a capacitance value of the data signal circuit of the first chip, (2) a first end electrically coupled to a second end of the first data signal inductor of the first chip, and to the capacitance value of the ESD circuit of the first chip, wherein loops of the first data signal inductor are disposed within a last silicon metal level LSML and a LSML-1 level of the first chip, and wherein loops of the second data signal inductor are disposed within the LSML-1 level of the first chip;
   a second integrated circuit chip having:
      a data signal receiver circuit disposed on a horizontal inner layer within the second chip and having a data signal output contact of the second chip;
      a data signal surface contact disposed on a horizontal surface of the second chip and electrically coupled to the data signal output contact of the second chip; and
   a chip package electrically coupling the data signal surface contact of the first chip to the data signal surface contact of the second chip.

12. The electronic system of claim 11, wherein the second integrated circuit chip further comprises:
   a first data signal inductor of the second chip having (1) a second end electrically coupled to a capacitance value of an electrostatic discharge (ESD) circuit of the second chip, and (2) a first end electrically coupled to a capacitance value at the data signal surface contact and to the data signal surface contact of the second chip; and
   a second data signal inductor of the second chip having (1) a second end electrically coupled to the data signal output contact of the data signal circuit of the second chip, and to a capacitance value of the data signal circuit of the second chip, (2) a first end electrically coupled to a second end of the first data signal inductor of the second chip, and to the capacitance value of the ESD circuit of the second chip.

13. The electronic system of claim 12, wherein the second and first data signal inductors of the first and second chips are located and electrically coupled to the data signal surface contacts, ESD circuits and data signal circuits of the first and second chips so that a data signal transmitted by the data signal circuit of the first chips flows in the same direction through the loops of the first and second data signal inductors of the first and second chips.

14. The electronic system of claim 12, wherein the second and first data signal inductors of the first and second chips are located and electrically coupled to the data signal surface contacts, ESD circuits and data signal circuits of the first and second chips so that a magnetic field produced by the second data signal inductor of the first and second chips when a data signal is output by the data signal transmit circuit of the first chip causes a magnetic field proportional to the data signal output by a coupling coefficient amount K, to be received by the first data signal inductor of the first and second chips.

15. The electronic system of claim 12, wherein, based on the capacitance value at the data signal surface contact of the first and second chips, the capacitance value of the data signal circuit of the first and second chips, and the capacitance value of the ESD circuit of the first and second chips,
a second inductance of the second data signal inductor of the first and second chips, and a first inductance of the first data signal inductor of the first and second chips are selected: (1) to have the impedance at the data signal surface contact of the first and second chips be approximately between 30 and 70 Ohms for an output signal having a frequency between 7.5 and 17 GHZ; and
(2) to have an insertion loss of the first and second chips of less than 3 dB between approximately 0 and 15 GHZ.

16. The electronic system of claim 12, wherein, based on the capacitance value at the data signal surface contact of the first and second chips, the capacitance value of the data signal circuit of the first and second chips, and the capacitance value of the ESD circuit of the first and second chips,
a second inductance of the second data signal inductor of the first and second chips, and a first inductance of the first data signal inductor of the first and second chips are selected to cause the second and first data signal inductors of the first and second chips to cancel out any parallel capacitance of the capacitance value at the data signal surface contact of the first and second chips, the capacitance value of the data signal circuit of the first and second chips, and the capacitance value of the ESD circuit of the first and second chips.

17. The electronic system of claim 12, wherein loops of the first data signal inductor of the second chip are disposed within a last silicon metal level LSML and a LSML-1 level of the second chip; and wherein loops of the second data signal inductor of the second chip are disposed within the LSML-1 level of the second chip.

18. The electronic system of claim 12, wherein loops of the first data signal inductor of the first and second chips cross on different levels of the chip of the first and second chips with loops of the second data signal inductor of the first and second chips so that a data signal transmitted by the data signal transmit circuit flow in the same direction through the loops of the first and second data signal inductors of the first and second chips.

19. The electronic system of claim 12, wherein loops of the first data signal inductor of the first and second chips cross on different levels of the chip of the first and second chips with loops of the second data signal inductor of the first and second chips so that a magnetic field produced by the second data signal inductor of the first and second chips when the data signal is output by the data signal transmit circuit causes a magnetic field proportional to the data signal output by a coupling coefficient amount K, to be received by the first data signal inductor of the first and second chips.

20. An electronic system comprising:
a first integrated circuit chip having:
a data signal transmitter circuit disposed on a horizontal inner layer within the first chip and having a data signal output contact of the first chip;
a data signal surface contact disposed on a horizontal surface of the first chip;
a first data signal inductor of the first chip having (1) a second end electrically coupled to a capacitance value of an electrostatic discharge (ESD) circuit of the first chip, and (2) a first end electrically coupled to a capacitance value at the data signal surface contact and to the data signal surface contact of the first chip; and
a second data signal inductor of the first chip having (1) a second end electrically coupled to the data signal output contact of the data signal circuit of the first chip, and to a capacitance value of the data signal circuit of the first chip, (2) a first end electrically coupled to a second end of the first data signal inductor of the first chip, and to the capacitance value of the ESD circuit of the first chip;
a second integrated circuit chip having:
a data signal receiver circuit disposed on a horizontal inner layer within the second chip and having a data signal output contact of the second chip;
a data signal surface contact disposed on a horizontal surface of the second chip and electrically coupled to the data signal output contact of the second chip;
a first data signal inductor of the second chip having (1) a second end electrically coupled to a capacitance value of an electrostatic discharge (ESD) circuit of the second chip, and (2) a first end electrically coupled to a capacitance value at the data signal surface contact and to the data signal surface contact of the second chip;
a second data signal inductor of the second chip having (1) a second end electrically coupled to the data signal output contact of the data signal circuit of the second chip, and to a capacitance value of the data signal circuit of the second chip, (2) a first end electrically coupled to a second end of the first data signal inductor of the second chip, and to the capacitance value of the ESD circuit of the second chip;
wherein loops of the first data signal inductor of the first and second chips cross on different levels of the chip of the first and second chips with loops of the second data signal inductor of the first and second chips so that a data signal transmitted by the data signal transmit circuit flow in the same direction through the loops of the first and second data signal inductors of the first and second chips; and
a chip package electrically coupling the data signal surface contact of the first chip to the data signal surface contact of the second chip.

* * * * *